US012696496B2

(12) United States Patent
Kinoshita

(10) Patent No.: US 12,696,496 B2
(45) Date of Patent: Jul. 28, 2026

(54) SILICON CARBIDE SEMICONDUCTOR DEVICE

(71) Applicant: FUJI ELECTRIC CO., LTD., Kawasaki (JP)

(72) Inventor: Akimasa Kinoshita, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 679 days.

(21) Appl. No.: 17/978,175

(22) Filed: Oct. 31, 2022

(65) Prior Publication Data

US 2023/0187489 A1 Jun. 15, 2023

(30) Foreign Application Priority Data

Dec. 15, 2021 (JP) ................................. 2021-203176
Feb. 10, 2022 (JP) ................................. 2022-019784

(51) Int. Cl.
H01L 29/06 (2006.01)
H10D 30/66 (2025.01)
(Continued)

(52) U.S. Cl.
CPC ......... H10D 62/107 (2025.01); H10D 30/665 (2025.01); H10D 30/668 (2025.01);
(Continued)

(58) Field of Classification Search
CPC .. H10D 62/107; H10D 30/665; H10D 30/668; H10D 62/8325; H10D 30/0297;
(Continued)

(56) References Cited

U.S. PATENT DOCUMENTS 6,300,171 B1 10/2001 Frisina
10,381,445 B2 * 8/2019 Hiyoshi ............... H10D 62/393
(Continued)

FOREIGN PATENT DOCUMENTS

JP 2000183350 A 6/2000
JP 2007173705 A 7/2007
(Continued)

OTHER PUBLICATIONS

Office Action issued for corresponding Japanese Patent Application No. 2022-019784, and its English translation, dated Sep. 30, 2025.

*Primary Examiner* — Cuong B Nguyen

(74) *Attorney, Agent, or Firm* — Rabin & Berdo, P.C.

(57) ABSTRACT

In an edge termination region, p-type regions and p⁻-type regions configuring a spatial modulation JTE structure are selectively provided at depth positions apart from a front surface of a semiconductor substrate. Respective bottoms of the p-type regions and the p⁻-type regions are at depth positions deeper from the front surface of the semiconductor substrate than is a bottom of a p-type peripheral region of a peripheral portion of an active region. An outer-side corner of the bottom of the p-type peripheral region is surrounded by an innermost one of the p-type regions and is free from contact with an n⁻-type drift region of the edge termination region.

10 Claims, 15 Drawing Sheets

(51) Int. Cl.

| | |
|---|---|
| *H10D 62/10* | (2025.01) |
| *H10D 62/832* | (2025.01) |
| *H10P 14/20* | (2026.01) |
| *H10P 30/22* | (2026.01) |

(52) U.S. Cl.
CPC ..... *H10D 62/8325* (2025.01); *H10P 14/3408* (2026.01); *H10P 14/3442* (2026.01); *H10P 30/22* (2026.01)

(58) Field of Classification Search
CPC .. H10D 30/662; H10D 62/157; H10D 62/112; H10D 62/393; H10D 62/124; H01L 21/02529; H01L 21/02576; H01L 21/0465; H10P 14/3408; H10P 14/3442; H10P 30/22
See application file for complete search history.

(56) References Cited

U.S. PATENT DOCUMENTS

| | | | |
|---|---|---|---|
| 2007/0272979 A1 | 11/2007 | Saito et al. | |
| 2014/0203393 A1 | 7/2014 | Kawakami et al. | |
| 2018/0166530 A1 | 6/2018 | Lichtenwalner et al. | |
| 2020/0006494 A1 | 1/2020 | Tsuji et al. | |
| 2020/0227549 A1 | 7/2020 | Noborio et al. | |

FOREIGN PATENT DOCUMENTS

| | | | |
|---|---|---|---|
| JP | 2008004643 A | 1/2008 |
| JP | 2019054087 A | 4/2019 |
| JP | 2020004876 A | 1/2020 |
| JP | 2020202404 A | 12/2020 |
| JP | 2021048423 A | 3/2021 |
| WO | 2013046908 A1 | 4/2013 |

* cited by examiner

END SIDE

CENTER SIDE

SILICON CARBIDE SEMICONDUCTOR DEVICE

CROSS REFERENCE TO RELATED APPLICATIONS

This application is based upon and claims the benefit of priority of the prior Japanese Patent Application No. 2021-203176, filed on Dec. 15, 2021, and 2022-019784, filed on Feb. 10, 2022, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, a voltage withstanding structure of a power semiconductor device is disposed in an edge termination region that is between an active region and an end of a semiconductor substrate (semiconductor chip); the voltage withstanding structure is configured by multiple p-type regions selectively provided in surface regions of an n⁻-type drift region exposed at a front surface of the semiconductor substrate, in the edge termination region. In an instance in which a semiconductor material of the power semiconductor device is silicon carbide (SiC), disposal of a spatial modulation junction termination extension (JTE) structure as the voltage withstanding structure is commonly known.

The JTE structure is a structure in which multiple p-type regions (hereinafter, JTE regions) are disposed adjacent to one another in descending order of impurity concentration in a direction from an inner side (center portion (chip center) side of a semiconductor substrate) to an outer side (end (chip end) side of the semiconductor substrate), the JTE regions being disposed in concentric shapes surrounding a periphery of the active region. Electric field strength tends to decrease from the active region to the chip end. In line with the trend of electric field strength distribution, the JTE regions are disposed so that respective impurity concentrations thereof are in descending order in the direction from the active region to the chip end, whereby a predetermined withstand voltage of the edge termination region is stably maintained.

The spatial modulation JTE structure is an improved JTE structure in which a spatial modulation region is disposed between two adjacent JTE regions (in an instance in which configuration includes only one JTE region, the one JTE region and the n⁻-type drift region adjacent thereto and relatively closer to the chip end); the spatial modulation region has an impurity concentration distribution that is spatially equivalent to an intermediate impurity concentration between the impurity concentrations of the two adjacent regions, whereby an overall p-type impurity concentration of the structure gradually decreases in a direction from the chip center to the chip end. The spatial modulation region is formed by repeatedly disposing two small regions alternately and adjacently to one another in a predetermined pattern, each of the two small regions having an impurity concentration that is substantially the same as that of the regions that are adjacent on both sides of the spatial modulation region.

An overall spatial impurity concentration distribution of the spatial modulation region is determined by the widths and the impurity concentration ratio of the two small regions. The spatial modulation JTE structure may ensure more stable predetermined withstand voltage of the edge termination region as compared to a general JTE structure without the spatial modulation region. In this manner, a predetermined voltage withstanding structure is disposed in the edge termination region and the electric field of the edge termination region is mitigated or distributed, whereby the withstand voltage of the edge termination region is enhanced and thus, the withstand voltage of the semiconductor device overall is enhanced. A structure of the conventional silicon carbide semiconductor device is described.

FIG. 13 is a cross-sectional view of the structure of the conventional silicon carbide semiconductor device. A conventional silicon carbide semiconductor device 110 depicted in FIG. 13 is a vertical metal oxide semiconductor field effect transistor (MOSFET) with a trench gate structure and having an insulated gate (MOS gate) with a 3-layered structure including a metal, a semiconductor, and an oxide film and further having a spatial modulation JTE structure 130 in an edge termination region 102 of a semiconductor substrate (semiconductor chip) 140 containing silicon carbide.

The semiconductor substrate 140 is formed by epitaxially growing, on an n⁺-type starting substrate 141 containing silicon carbide, an n⁻-type silicon carbide layer 142 that constitutes an n⁻-type drift region 112. The semiconductor substrate 140 has, as a front surface, a main surface that includes the n⁻-type silicon carbide layer 142 and has, as a back surface, a main surface that includes the n⁺-type starting substrate 141. The entire front surface of the semiconductor substrate 140 is flat and no step occurs between an active region 101 and the edge termination region 102. The active region 101 has a center portion 101a in which multiple unit cells (functional units of device element) of the MOSFET are provided adjacently to one another.

The active region 101 has a peripheral portion 101b in which in an entire area between the front surface of the semiconductor substrate 140 and the n⁻-type drift region 112, sequentially from the front surface of the semiconductor substrate 140, a p⁺⁺-type contact extension portion 115a, a p-type base extension portion 113a, and a p⁺-type extension portion 122a are provided adjacent to one another in a depth direction. The p⁺⁺-type contact extension portion 115a is exposed at the front surface of the semiconductor substrate 140 to be in contact with an insulating layer (a field oxide film 125 and an interlayer insulating film 119) on the front surface of the semiconductor substrate 140.

The p⁺⁺-type contact extension portion 115a, the p-type base extension portion 113a, and the p⁺-type extension portion 122a surround a periphery of the center portion 101a of the active region 101 and are, respectively, extension portions of a p⁺⁺-type contact region 115, a p-type base region 113, and a p⁺-type region 122 of an outermost unit cell that of the unit cells of the center portion 101a of the active region 101 is closest to the chip end. Outer ends of the p⁺⁺-type contact extension portion 115a, the p-type base extension portion 113a, and the p⁺-type extension portion 122a terminate at substantially a same position in a direction of a normal from the chip center to the chip end and are on a same plane orthogonal to the front surface of the semiconductor substrate 140.

The edge termination region 102 surrounds a periphery of the active region 101. The spatial modulation JTE structure 130 is provided in the edge termination region 102 as a voltage withstanding structure. The spatial modulation JTE structure 130 is configured by multiple p-type regions 131 and multiple p⁻-type regions 132 selectively provided between the front surface of the semiconductor substrate 140 and the n⁻-type drift region 112. All the p-type regions 131 and the p⁻-type regions 132 are exposed at the front surface of the semiconductor substrate 140 and are in contact with the insulating layer on the front surface of the semiconductor substrate 140.

The p-type regions 131 are disposed apart from one another in a concentric pattern that surrounds the periphery of the active region 101. An innermost one of the p-type regions 131, that is closest to the chip center, is disposed adjacent to the p⁺⁺-type contact extension portion 115a and is closer to the chip end than is the p⁺⁺-type contact extension portion 115a. The p⁻-type regions 132 are disposed apart from one another in a concentric pattern that surrounds the periphery of the active region 101. An innermost one of the p⁻-type regions 132, that is closest to the chip center, is provided between all the p-type regions 131 that are adjacent to one another and is adjacent to the p-type regions 131 on both sides in the direction of the normal.

The innermost one of the p⁻-type regions 132 extends closer to the chip end than is an outermost one of the p-type regions 131, that is closest to the chip end. All the p-type regions 131 and the innermost one of the p⁻-type regions 132 are fixed to a potential of a source electrode 120, via the p⁺⁺-type contact extension portion 115a. The p⁻-type regions 132 other than the innermost one of the p⁻-type regions 132 are disposed closer to the chip end than are the p-type regions 131. Portions of the n⁻-type drift region 112 are provided between all the p⁻-type regions 132 that are adjacent to one another, and between the p⁻-type regions 132 that are adjacent to one another, are exposed at the front surface of the semiconductor substrate 140.

Reference numerals 113, 114, 115, 116, 117, and 118 represent, respectively, the p-type base region 113, n⁺-type source regions 114, the p⁺⁺-type contact region 115, trenches 116, a gate insulating film 117, and gate electrodes 118 that configure the trench gate structure and are provided in the front side of the semiconductor substrate 140, in the active region 101. Reference numerals 111, 123, 126, and 133 represent, respectively, an n⁺-type drain region 111, a drain electrode 123, a gate polysilicon wiring layer 126, and an n⁺-type channel stopper 133. Reference numerals 121 and 122 represent p⁺-type regions 121, 122 that mitigate electric field applied to the gate insulating film 117 at the bottoms of the trenches 116.

As for a conventional semiconductor device, a device has been proposed in which a p-type region configuring a voltage withstanding structure is disposed at a depth position that is apart from the front surface of semiconductor substrate so that a bottom (end closest to back surface of the semiconductor substrate) of the p-type region is at a same depth position as that of a bottom of a p-type region that forms an outermost peripheral end (hereinafter, main junction end) of a main junction (pn junction) of the active region (for example, refer to Japanese Laid-Open Patent Publication No. 2020-202404, Japanese Laid-Open Patent Publication No. 2021-048423, and Japanese Laid-Open Patent Publication No. 2007-173705). In Japanese Laid-Open Patent Publication No. 2020-202404, electric field concentration at the main junction end of the active region is suppressed by the p-type regions of the JTE structure in which, on the outer side of the p-type region that forms the main junction end of the active region, bottoms of the p-type regions are adjacent and at depth positions that are aligned.

Further, in Japanese Laid-Open Patent Publication No. 2020-202404, in the structure in which the entire area of the front surface of the semiconductor substrate is flat, the p-type regions of the active region and the p-type regions configuring the JTE structure are formed at the same depth position from the front surface of the semiconductor substrate, whereby alignment accuracy by photolithography is enhanced. In Japanese Laid-Open Patent Publication No. 2021-048423, by a low-impurity concentration n⁻-type or p⁻-type silicon carbide layer disposed between the front surface of the semiconductor substrate and the voltage withstanding structure, the voltage withstanding structure is protected and electric field of the front surface of the semiconductor substrate is mitigated.

In Japanese Laid-Open Patent Publication No. 2007-173705, in a field limiting ring (FLR) that is a p-type region having a floating potential and configuring the voltage withstanding structure, an impurity concentration distribution in which the impurity concentration is relatively low at the back side of the semiconductor substrate and the impurity concentration at the front side of the semiconductor substrate is relatively high is formed, whereby the withstand voltage is enhanced. Further, in Japanese Laid-Open Patent Publication No. 2021-048423 and Japanese Laid-Open Patent Publication No. 2007-173705, the p-type regions configuring the voltage withstanding structure and the p-type regions of the active region are formed concurrently at the same depth, whereby the number of processes is reduced.

Further, as another conventional semiconductor device, a device has been proposed in which embedded FLRs are selectively provided so as to be embedded at depth positions apart from the front surface of the semiconductor substrate so that portions where electric field concentration tends to occur such as an outer-side corner of the bottom of the p-type region forming the main junction end of the active region, an outer-side corner of the bottoms of the FLRs of the edge termination region, etc. are each individually surrounded (for example, refer to Japanese Laid-Open Patent Publication No. 2008-004643). In Japanese Laid-Open Patent Publication No. 2008-004643, local electric field concentration at portions where electric field tends to concentrate is suppressed by the embedded FLRs.

As another conventional semiconductor device, a device has been proposed in which the drift layer is a super junction (SJ) structure that is a parallel pn layer in which n-type regions and p-type regions are disposed repeatedly alternating with one another in a direction parallel to the front surface of the semiconductor substrate, and the p-type regions of the parallel pn layer in the edge termination region are disposed at depth positions apart from the front surface of the semiconductor substrate and the closer the p-type regions of the parallel pn layer are disposed to the chip end, the shorter is a length thereof in the depth direction (for example, refer to Japanese Laid-Open Patent Publication No. 2000-183350). In Japanese Laid-Open Patent Publication No. 2000-183350, the radius of curvature of an isoelectric line in the edge termination region is increased, thereby, realizing high withstand voltage.

SUMMARY OF THE INVENTION

According to an embodiment of the invention, a silicon carbide semiconductor device includes: a semiconductor substrate containing silicon carbide and having a first main surface and a second main surface that are opposite to each other, the entire first main surface being flat; an active region provided in the semiconductor substrate; a termination region provided in the semiconductor substrate, surrounding a periphery of the active region; a first semiconductor region of a first conductivity type, provided in the semiconductor substrate, spanning the active region and the termination region; a second semiconductor region of a second conductivity type, provided in the active region, between the first main surface and the first semiconductor region; a device element structure provided in the active region, and having a pn junction between the first semiconductor region and the second semiconductor region, a current passing through the pn junction flowing through the device element structure; a second-conductivity-type peripheral region provided between the first main surface and the first semiconductor region, between the device element structure and the termination region, the second-conductivity-type peripheral region surrounding a periphery of the device element structure; a first electrode provided at the first main surface, the first electrode being electrically connected to the second semiconductor region and the second-conductivity-type peripheral region; a second electrode provided at the second main surface of the semiconductor substrate, the second electrode being electrically connected to the first semiconductor region; a plurality of second-conductivity-type withstand voltage regions provided in the first semiconductor region in the termination region, at a position apart from the first main surface in a depth direction, the second-conductivity-type withstand voltage regions being provided in a concentric shape surrounding the periphery of the active region and being apart from one another in a direction of the normal to the concentric shape; and a voltage withstanding structure configured by the second-conductivity-type withstand voltage regions and having an overall impurity concentration of the second conductivity type, which gradually decreases in a direction from the active region to the termination region. The second-conductivity-type peripheral region has an outer end at a side thereof where the termination region is provided, the outer end of the second-conductivity-type peripheral region being orthogonal to the first main surface. Bottoms of the second-conductivity-type withstand voltage regions are positioned deeper in the depth direction from the first main surface than is a bottom of the second-conductivity-type peripheral region. A first second-conductivity-type withstand voltage region, which is an innermost one of the second-conductivity-type withstand voltage regions, surrounds the second-conductivity-type peripheral region so as to cover an outer-side corner of the bottom of the second-conductivity-type peripheral region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a cross-sectional view of a structure along cutting line A-A' in FIG. 1.

FIG. 3 is a cross-sectional view depicting a state of the silicon carbide semiconductor device according to the first embodiment during manufacture.

FIG. 4 is a cross-sectional view depicting a state of the silicon carbide semiconductor device according to the first embodiment during manufacture.

FIG. 7 is a cross-sectional view depicting a state of the silicon carbide semiconductor device according to the second embodiment during manufacture.

FIG. 8 is a cross-sectional view depicting a state of the silicon carbide semiconductor device according to the second embodiment during manufacture.

FIG. 9 is a cross-sectional view depicting a state of the silicon carbide semiconductor device according to the second embodiment during manufacture.

DETAILED DESCRIPTION OF THE INVENTION

First, problems associated with the conventional techniques are discussed. In a structure (not depicted) in which a p-type silicon carbide layer constituting the p-type base regions is provided only in the active region by epitaxial growth, at the front surface of the semiconductor substrate, a step is formed such that the front surface of the semiconductor substrate in the edge termination region is closer to the drain electrode than in the active region. Closer to the chip end than is the step, the voltage withstanding structure is formed in a surface region of the $n^-$-type silicon carbide layer ($n^-$-type drift region) that is exposed at the front surface of the semiconductor substrate. The p-type region configuring the main junction end of the active region extends closer to the chip end than is the step, is exposed at the front surface of the semiconductor substrate, and the outer-side corner of the bottom thereof is surrounded by the voltage withstanding structure.

Figure 13:
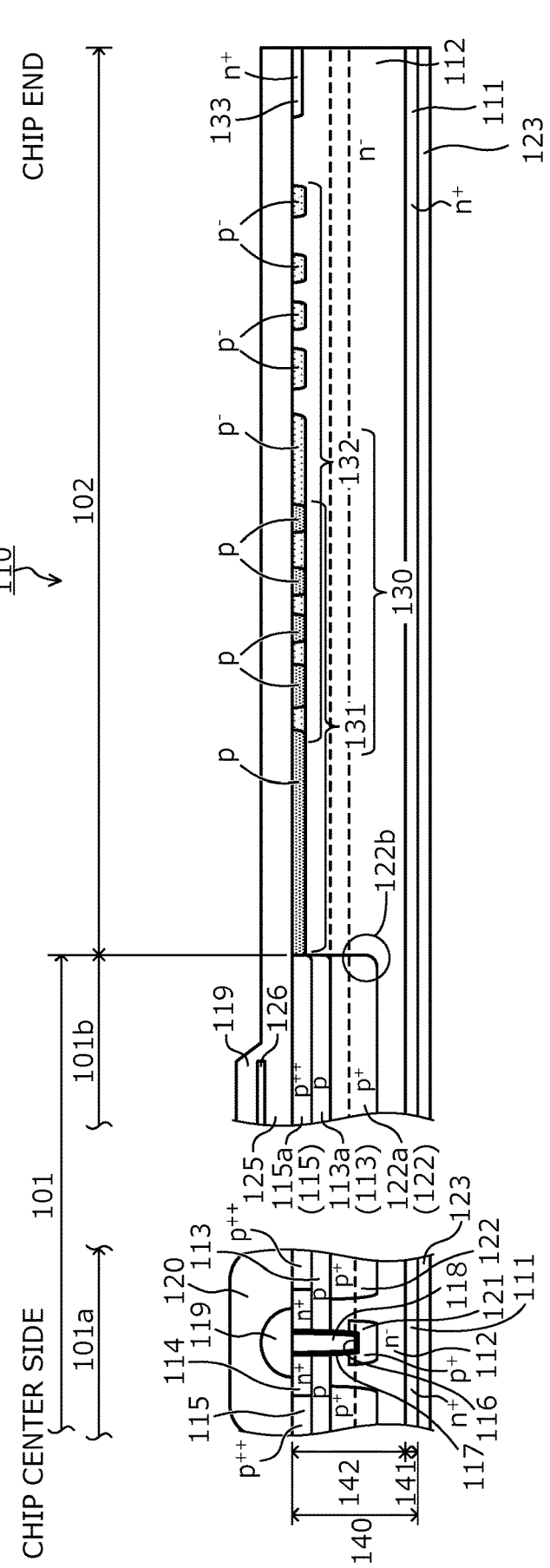
FIG. 13 is a cross-sectional view of a structure of a conventional silicon carbide semiconductor device.

However, in the conventional silicon carbide semiconductor device 110 (refer to FIG. 13), the entire front surface of the semiconductor substrate is flat. Thus, when a device element structure, such as the trench gate structure, that reaches a deep position from the front surface of the semiconductor substrate 140 is formed in the active region 101, the depth position of the bottom (back-surface end of the semiconductor substrate 140) of the voltage withstanding structure (the p-type regions 131 and the $p^-$-type regions 132) is shallow from the front surface of the semiconductor substrate 140 relative to the depth position of the bottom of the p-type region forming the main junction end of the active region 101 (the bottom of the $p^+$-type extension portion 122a).

The depth position of the bottom of the p-type region configuring the voltage withstanding structure is shallow, whereby the structure is such that an outer-side corner 122b of the bottom of the p-type region configuring the main junction end of the active region 101 is surrounded by the n⁻-type drift region 112. Thus, electric field concentrates in the outer-side corner 122b, whereby avalanche breakdown in the outer-side corner 122b is facilitated and the withstand voltage of the edge termination region 102 becomes lower than the withstand voltage of the active region 101. The withstand voltage for the conventional silicon carbide semiconductor device 110 overall is determined by the withstand voltage of the edge termination region 102 and therefore, reliability decreases.

Assuming that the withstand voltage of the edge termination region 102 can be secured to be higher than the withstand voltage of the active region 101, the difference of the withstand voltage voltages is small and when for some reason, the secured withstand voltage of the active region 101 is high, the withstand voltage of the edge termination region 102 may become lower than the withstand voltage of the active region 101. To suppress such decreases in the withstand voltage of the edge termination region, like Japanese Laid-Open Patent Publication No. 2020-202404, Japanese Laid-Open Patent Publication No. 2021-048423, Japanese Laid-Open Patent Publication No. 2007-173705, and Japanese Laid-Open Patent Publication No. 2008-004643 above, devices have been proposed in which the p-type regions configuring the voltage withstanding structure are disposed so that the bottoms thereof are positioned at the same depth as the bottom of the p-type region that configures the main junction end of the active region, whereby local electric field concentration is suppressed.

Further, in a general voltage withstanding structure, the number of processes and the cost are reduced by forming the p-type regions configuring the voltage withstanding structure concurrently with and by the same ion implantation as the p-type regions having the same depth and the same impurity concentration in the active region. Therefore, like Japanese Laid-Open Patent Publication No. 2021-048423 and Japanese Laid-Open Patent Publication No. 2007-173705 above, in an instance in which the voltage withstanding structure is configured by multiple p-type regions (FLRs) of the same depth and the same impurity concentration as that of the p-type regions in the active region, the number of processes is reduced and the bottoms of the p-type regions of the active region and the bottoms of the p-type regions configuring the voltage withstanding structure may be easily aligned, positioned at the same depth.

Nonetheless, in an instance in which the impurity concentration of the p-type regions of the active region and the impurity concentration of the p-type regions configuring the voltage withstanding structure differ like the JTE structure in Japanese Laid-Open Patent Publication No. 2020-202404 above, the p-type regions of the active region and the p-type regions configuring the voltage withstanding structure are formed by different ion implantation processes. The impurity concentrations of these p-type regions are adjusted by ion implantation under different conditions (number of stages, dose amounts) suitably set for each and thus, positioning the bottoms of the p-type regions configuring the voltage withstanding structure and the bottom of the outermost p-type region in the active region at the same depth is difficult.

Further, in Japanese Laid-Open Patent Publication No. 2020-202404, Japanese Laid-Open Patent Publication No. 2021-048423, Japanese Laid-Open Patent Publication No. 2007-173705, Japanese Laid-Open Patent Publication No. 2008-004643, and Japanese Laid-Open Patent Publication No. 2000-183350 above, the structure is such that in the edge termination region, the n⁻-type drift region remains between the front surface of the semiconductor substrate and the voltage withstanding structure (in Japanese Laid-Open Patent Publication No. 2000-183350, the SJ structure). Thus, problems arise in that when the insulating layer on the front surface of the semiconductor substrate in the edge termination region is negatively charged (stores negative charge) due to long hours of operation of the semiconductor device, adverse effects of the negative charge stored in the insulating layer are large, the withstand voltage of the edge termination region fluctuates, and reliability decreases over time.

Figure 1:
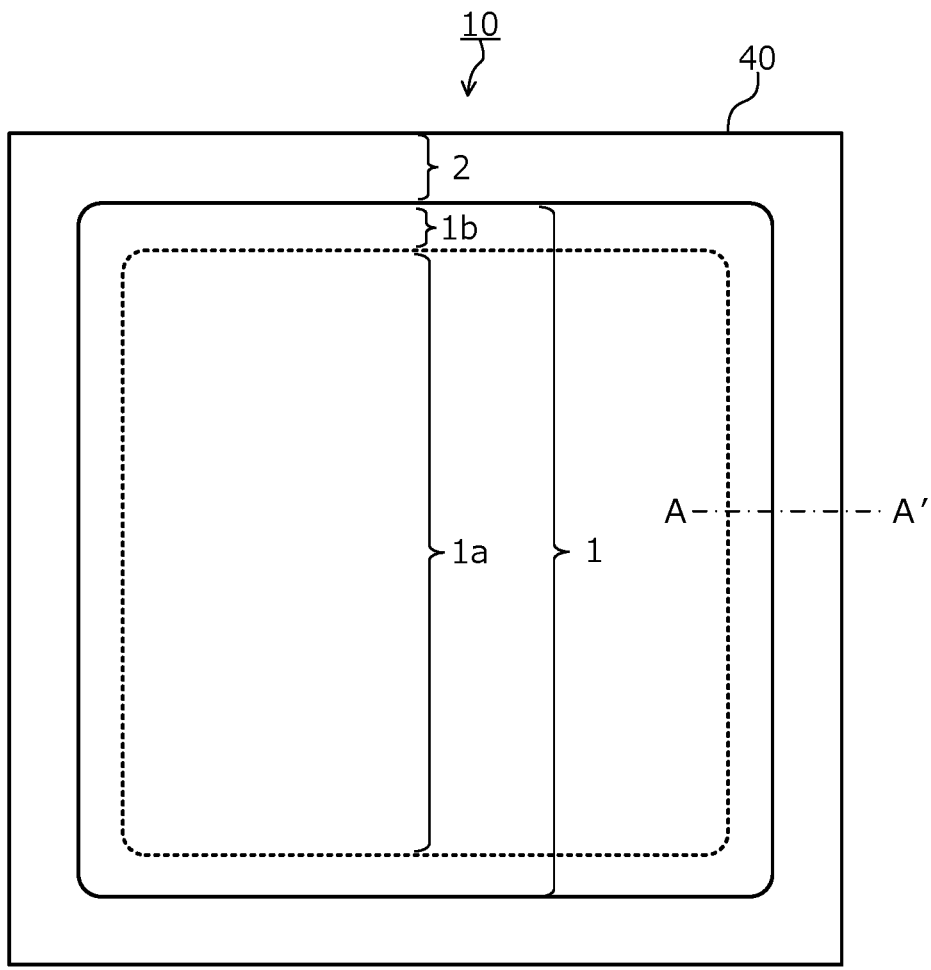
FIG. 1 is a plan view depicting a layout when a silicon carbide semiconductor device according to a first embodiment is viewed from a front side of a semiconductor substrate thereof.
Figure 2:
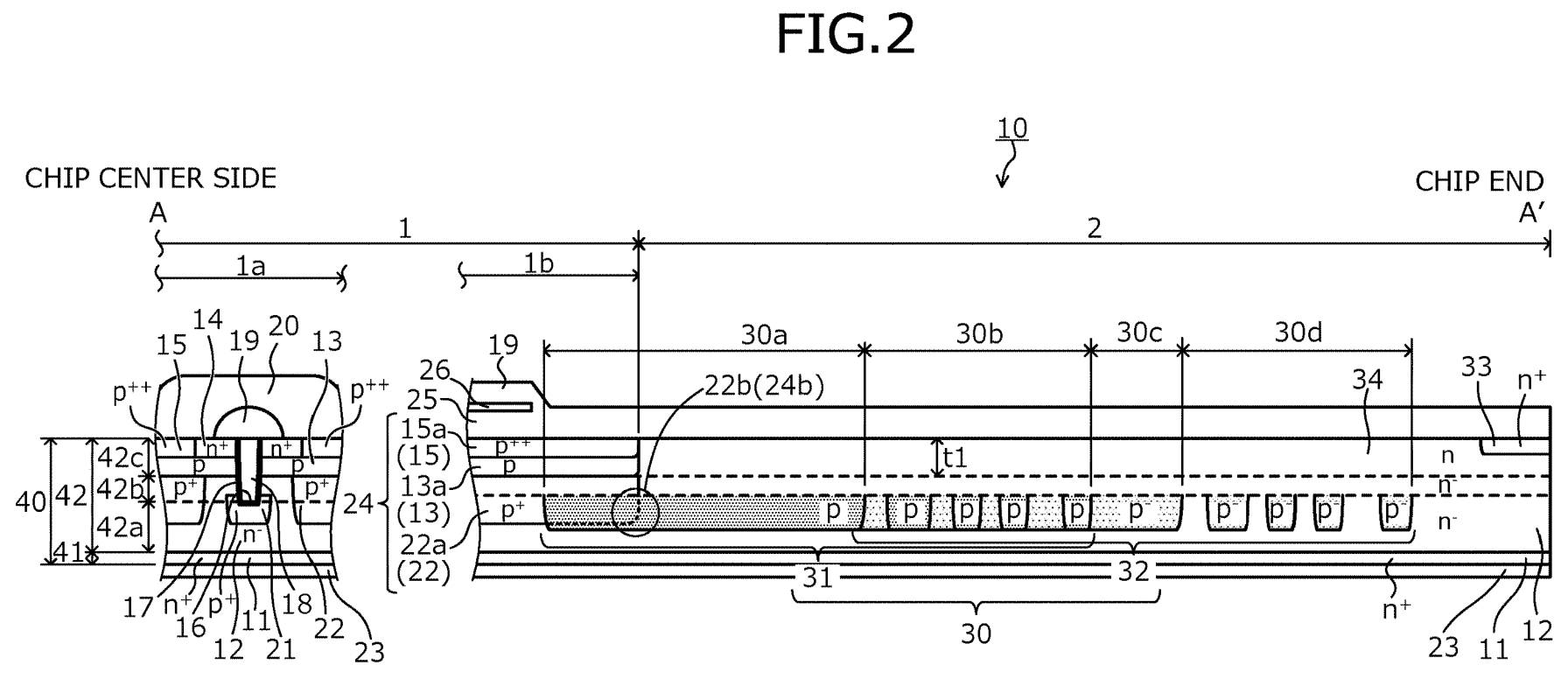

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the A structure of a silicon carbide semiconductor device according to a first embodiment is described. FIG. 1 is a plan view depicting a layout when the silicon carbide semiconductor device according to the first embodiment is viewed from a front side of a semiconductor substrate thereof. FIG. 2 is a cross-sectional view of the structure along cutting line A-A' in FIG. 1. A silicon carbide semiconductor device 10 according to the first embodiment depicted in FIGS. 1 and 2 is a vertical MOSFET having a trench gate structure (device element structure) and a spatial modulation JTE structure 30 provided, respectively, in an active region 1 and an edge termination region 2 of a semiconductor substrate (semiconductor chip) 40 containing silicon carbide (SiC).

The active region 1 is a region through which a main current (drift current) flows when the MOSFET is on. The active region 1 has a substantially rectangular shape in a plan view and is disposed in substantially a center (chip center) of the semiconductor substrate 40. The active region 1 is a portion in the center (center portion) of the semiconductor substrate 40, extending from an outer end (end facing an end (chip end) of the semiconductor substrate 40) of a later-described p⁺⁺-type contact extension portion 15a. In a center portion 1a of the active region 1, multiple unit cells (functional units of a device element) of the MOSFET, connected in parallel, and having the same trench gate structure are disposed adjacently.

The edge termination region 2 is a region between the active region 1 and the chip end and surrounds a periphery of the active region 1 in a substantially rectangular shape. Withstand voltage is a voltage limit at which a drain-source voltage does not further increase even when a drain-source current increases due to avalanche breakdown occurring at pn junctions. In the edge termination region, the spatial modulation JTE structure 30 is provided as a voltage withstanding structure. The spatial modulation JTE structure 30 has a function of mitigating electric field near a border between the active region 1 and the edge termination region 2 and sustaining the withstand voltage. Configuration of the spatial modulation JTE structure 30 is described hereinafter.

The semiconductor substrate 40 is formed by epitaxially growing a silicon carbide layer 42 of an n-type and constituting an n⁻-type drift region (first semiconductor region) 12 on a front surface of an n⁺-type starting substrate 41 containing silicon carbide. The semiconductor substrate 40 has, as a front surface (first main surface), a main surface that includes the silicon carbide layer 42 and has, as a back surface (second main surface), a main surface that includes the $n^+$-type starting substrate 41. The entire front surface of the semiconductor substrate 40 is substantially a flat surface and no step occurs between the active region 1 and the edge termination region 2. Substantially flat means a horizontal plane within a range including an allowable error due to process variation.

The $n^+$-type starting substrate 41 is an $n^+$-type drain region 11. The silicon carbide layer 42 is an n-type epitaxial layer in which $n^-$-type silicon carbide layers 42a, 42b constituting the $n^-$-type drift region 12, and an n-type silicon carbide layer 42c constituting a first n-type surface region (fourth semiconductor region) 34 are sequentially stacked. The $n^-$-type drift region 12 is a portion of the $n^-$-type silicon carbide layers 42a, 42b, free of diffused regions formed by ion implantation and having an impurity concentration that is the impurity concentration at the time of the epitaxial growth. The $n^-$-type drift region 12 is in contact with the $n^+$-type starting substrate 41 and is provided spanning the active region 1 and the edge termination region 2.

The trench gate structure is configured by a p-type base region (second semiconductor region) 13, $n^+$-type source regions (third semiconductor regions) 14, $p^{++}$-type contact regions 15, trenches 16, a gate insulating film 17, and gate electrodes 18, and is provided in the front side of the semiconductor substrate 40, in the center portion 1a of the active region 1. The p-type base region 13, $n^+$-type source regions 14, and the $p^{++}$-type contact regions 15 are diffused regions formed in the n-type silicon carbide layer 42c by ion implantation. The p-type base region 13 is provided in the active region 1, between the front surface of the semiconductor substrate 40 and the $n^-$-type drift region 12.

The $n^+$-type source regions 14 and the $p^{++}$-type contact regions 15 are selectively provided between the front surface of the semiconductor substrate 40 and the p-type base region 13, each having a bottom (bottom surface that is an end closest to the back surface of the semiconductor substrate 40) in contact with the p-type base region 13, and an upper surface (end closest the front surface of the semiconductor substrate 40) exposed at the front surface of the semiconductor substrate 40. In the active region 1, being exposed at the front surface of the semiconductor substrate 40 means being in contact with a source electrode 20, in a contact hole of an interlayer insulating film 19. The $n^+$-type source regions 14 are provided only in the center portion 1a of the active region 1.

The p-type base region 13 and the $p^{++}$-type contact region 15 at an outermost unit cell extend to a peripheral portion 1b of the active region 1 and terminate at the border between the active region 1 and the edge termination region 2. Configuration may be such that the $p^{++}$-type contact regions 15 (i.e., the $p^{++}$-type contact extension portion 15a) are provided only in the peripheral portion 1b of the active region 1. In this instance, in the center portion 1a of the active region 1, instead of the $p^{++}$-type contact regions 15, the p-type base region 13 reaches the front surface of the semiconductor substrate 40 and is exposed at the front surface of the semiconductor substrate 40.

In the center portion 1a of the active region 1, an n-type current spreading region (not depicted) may be provided between the $n^-$-type drift region 12 and the p-type base region 13. The n-type current spreading region is a so-called current spreading layer (CSL) that reduces carrier spreading resistance. The n-type current spreading region is a diffused region formed in the $n^-$-type silicon carbide layers 42a, 42b by ion implantation. The n-type current spreading region reaches a deep position closer to the $n^+$-type drain region 11 (back surface of the semiconductor substrate 40) than are the bottoms of the trenches 16.

The n-type current spreading region has an upper surface in contact with the p-type base region 13 and a bottom in contact with the $n^-$-type drift region 12. In an instance in which the n-type current spreading region is not provided, an upper surface of the $n^-$-type drift region 12 is in contact with the p-type base region 13. Further, the n-type current spreading region (in an instance in which the n-type current spreading region is not provided, the $n^-$-type drift region 12) reaches the trenches 16 in a direction parallel to the front surface of the semiconductor substrate 40 and is in contact with the gate insulating film 17. The n-type current spreading region may extend to the peripheral portion 1b of the active region 1 to an extent that the n-type current spreading region does not reach the spatial modulation JTE structure 30.

Between the $n^-$-type drift region 12 and the p-type base region 13, $p^+$-type regions (second-conductivity-type high-concentration regions) 21, 22 are each selectively provided at deep positions closer to the $n^+$-type drain region 11 than are the bottoms of the trenches 16. The $p^+$-type regions 21, 22 are diffused regions formed in the $n^-$-type silicon carbide layers 42a, 42b by ion implantation. The $p^+$-type regions 21, 22 have a function of mitigating electric field applied to the gate insulating film 17 at the bottoms of the trenches 16. The $p^+$-type regions 21, 22 are in contact with the n-type current spreading region and the $n^-$-type drift region 12.

The $p^+$-type regions 21 are provided apart from the p-type base region 13 and face, respectively, the bottoms of the trenches 16 in the depth direction. The $p^+$-type regions 21 may be in contact with the gate insulating film 17 at the bottoms of the trenches 16. Each of the $p^+$-type regions 22 is provided between a respective adjacent two of the trenches 16 so as to be apart from the $p^+$-type regions 21 and the trenches 16 and each has an upper surface in contact with the p-type base region 13. The $p^+$-type region 22 of the outermost unit cell extends to the peripheral portion 1b of the active region 1 and terminates at the border between the active region 1 and the edge termination region 2.

The trenches 16 penetrate the $n^+$-type source regions 14 and the p-type base region 13 in the depth direction and reach the $n^-$-type drift region 12 (in an instance in which the n-type current spreading region is provided, the n-type current spreading region). The trenches 16, for example, extend in a striped pattern in a direction parallel to the front surface of the semiconductor substrate 40 and reach the peripheral portion 1b of the active region 1. The p-type base region 13, the $n^+$-type source regions 14, the $p^{++}$-type contact regions 15, and the $p^+$-type regions 22 extend linearly between adjacent trenches of the trenches 16 in a direction parallel to a longitudinal direction of the trenches 16.

The $p^{++}$-type contact regions 15 may be scattered between the adjacent trenches of the trenches 16, in the longitudinal direction of the trenches 16. The $p^+$-type regions 21 are positioned facing the bottoms of the trenches 16 and extend linearly in the longitudinal direction of the trenches 16. The gate electrodes 18 are provided on the gate insulating film 17 in the trenches 16. All the gate electrodes 18 are electrically connected to a gate pad (electrode pad, not depicted) via a gate polysilicon wiring layer 26 and a gate metal wiring layer (not depicted).

The peripheral portion 1b of the active region 1 surrounds a periphery of the center portion 1a of the active region 1 in substantially a rectangular shape. In the longitudinal direction of the trenches 16, the peripheral portion 1$b$ of the active region 1 is a portion from outermost ends of the n$^+$-type source regions 14 to the border between the active region 1 and the edge termination region 2. In a transverse direction of the trenches 16, the peripheral portion 1$b$ of the active region 1 is a portion from an outermost one of the sidewalls of an outermost one of the trenches 16 to the border between the active region 1 and the edge termination region 2.

In the peripheral portion 1$b$ of the active region 1, in an entire area between the front surface of the semiconductor substrate 40 and the n$^-$-type drift region 12, the p$^{++}$-type contact extension portion (third peripheral region) 15$a$, a p-type base extension portion (first peripheral region) 13$a$, and a p$^+$-type extension portion (second peripheral region) 22$a$ are provided adjacent to one another in order stated from the front surface of the semiconductor substrate 40 in the depth direction. The p$^{++}$-type contact extension portion 15$a$, the p-type base extension portion 13$a$, and the p$^+$-type extension portion 22$a$ are diffused regions formed in the silicon carbide layer 42 by ion implantation.

The p$^{++}$-type contact extension portion 15$a$, the p-type base extension portion 13$a$, and the p$^+$-type extension portion 22$a$ are, respectively, extended portions of the p$^{++}$-type contact region 15, the p-type base region 13, and the p$^+$-type region 22 at the outer most unit cell in the center portion 1$a$ of the active region 1, and surround the periphery of the center portion 1$a$ of the active region 1 in substantially a rectangular shape. Outer ends of the p$^{++}$-type contact extension portion 15$a$, the p-type base extension portion 13$a$, and the p$^+$-type extension portion 22$a$ terminate at substantially a same position (specifically, the border between the active region 1 and the edge termination region 2) in a direction of a normal from the chip center to the chip end.

The p-type base extension portion 13$a$ is provided between the front surface of the semiconductor substrate 40 and the n$^-$-type drift region 12 and is in contact with the n$^-$-type drift region 12. The p$^{++}$-type contact extension portion 15$a$ is provided between the front surface of the semiconductor substrate 40 and the p-type base extension portion 13$a$ and is in contact with the p-type base extension portion 13$a$. The p$^{++}$-type contact extension portion 15$a$ is exposed at the front surface of the semiconductor substrate 40 and is in contact with an insulating layer (insulating layer in which a field oxide film 25 and the interlayer insulating film 19 are sequentially stacked in order stated) on the front surface of the semiconductor substrate 40.

The p$^+$-type extension portion 22$a$ is provided between and in contact with the p-type base extension portion 13$a$ and the n$^-$-type drift region 12. Ends of all the p$^+$-type regions 21, 22 in the longitudinal direction are connected to the p$^+$-type extension portion 22$a$. The p$^{++}$-type contact extension portion 15$a$, the p-type base extension portion 13$a$, and the p$^+$-type extension portion 22$a$ form one p-type peripheral region (second-conductivity-type peripheral region) 24 in an entire area between the front surface of the semiconductor substrate 40 and the n$^-$-type drift region 12 in the peripheral portion 1$b$ of the active region 1.

As described above, the outer ends of the p$^{++}$-type contact extension portion 15$a$, the p-type base extension portion 13$a$, and the p$^+$-type extension portion 22$a$ configuring the p-type peripheral region 24 terminate at substantially the same position and are on a same plane orthogonal to the front surface of the semiconductor substrate 40. In other words, the outer end of the p-type peripheral region 24 is a face that spans an entire area in the depth direction and is substantially orthogonal to the front surface of the semiconductor substrate 40. The p-type peripheral region 24 has a function of making the electric field uniform at the front surface of the semiconductor substrate 40 in the peripheral portion 1$b$ of the active region 1.

Further, the p-type peripheral region 24 is a region for pulling out to the source electrode 20, hole current that is generated by the n$^-$-type drift region 12 of the edge termination region 2 when the MOSFET (the silicon carbide semiconductor device 10) is off and flows to the active region 1, the p-type peripheral region 24 being electrically connected to the source electrode 20. When the MOSFET is off, the hole current that is generated by the n$^-$-type drift region 12 of the edge termination region 2 is pulled out to the source electrode 20 via the p-type peripheral region 24, whereby the concentration of hole current during avalanche breakdown in the edge termination region 2 is suppressed.

The interlayer insulating film 19 is provided in the entire front surface of the semiconductor substrate 40 and covers the gate electrodes 18 and the gate polysilicon wiring layer 26. In the peripheral portion 1$b$ of the active region 1 and the edge termination region 2, the field oxide film 25 is provided between the front surface of the semiconductor substrate 40 and the interlayer insulating film 19. The gate polysilicon wiring layer 26 is provided between the field oxide film 25 and the interlayer insulating film 19, in the peripheral portion 1$b$ of the active region 1. The gate polysilicon wiring layer 26 surrounds the periphery of the center portion 1$a$ of the active region 1.

The gate metal wiring layer (not depicted) is provided on the gate polysilicon wiring layer 26, via a contact hole in the interlayer insulating film 19. The gate polysilicon wiring layer 26 and the gate metal wiring layer configure a gate runner. Preferably, directly beneath the gate runner may be the same structure and directly beneath the gate runner, only the p-type peripheral region 24 is disposed between the front surface of the semiconductor substrate 40 and the n$^-$-type drift region 12. The gate runner is disposed closer to the chip center than is the spatial modulation JTE structure 30 of the edge termination region 2.

The source electrode (first electrode) 20 is provided on the interlayer insulating film 19 so as to be embedded in a contact hole of the interlayer insulating film 19. In the center portion 1$a$ of the active region 1, via a contact hole provided in the interlayer insulating film 19, the source electrode 20 is in ohmic contact with the n$^+$-type source regions 14 and the p$^{++}$-type contact regions 15 (in an instance in which the p$^{++}$-type contact regions 15 are omitted, the p-type base region 13), and is electrically connected to the n$^+$-type source regions 14, the p$^{++}$-type contact regions 15, the p-type base region 13, and the p$^+$-type regions 21, 22.

In the peripheral portion 1$b$ of the active region 1, via a contact hole provided in the interlayer insulating film 19, the source electrode 20 is in ohmic contact with the p$^{++}$-type contact extension portion 15$a$ and is electrically connected to the p$^{++}$-type contact extension portion 15$a$, the p-type base extension portion 13$a$, and the p$^+$-type extension portion 22$a$. A drain electrode (second electrode) 23 is provided in the entire back surface (back surface of the n$^+$-type starting substrate 41) of the semiconductor substrate 40, is in ohmic contact with the n$^+$-type drain region 11 (the n$^+$-type starting substrate 41), and is electrically connected to the n$^+$-type drain region 11.

In the edge termination region 2, at depth positions apart from the front surface of the semiconductor substrate 40, multiple p-type regions (second-conductivity-type withstand voltage regions) 31 and multiple p$^-$-type regions (second-conductivity-type withstand voltage regions) 32 configuring the spatial modulation JTE structure 30 are selectively provided between the front surface of the semiconductor substrate 40 and the n⁻-type drift region 12. The first n-type surface region 34 is between the front surface of the semiconductor substrate 40 and the spatial modulation JTE structure 30. Between the front surface of the semiconductor substrate 40 and the n⁻-type drift region 12, an n⁺-type channel stopper region (sixth semiconductor region) 33 is selectively provided closer to the chip end than is the first n-type surface region 34.

The p-type regions 31 and the p⁻-type regions 32 are diffused regions formed in the n⁻-type silicon carbide layer 42a (or in the n⁻-type silicon carbide layer 42a, straddling the n⁻-type silicon carbide layers 42a, 42b in the depth direction) by ion implantation. In FIG. 2, the p-type regions 31 and the p⁻-type regions 32 are indicated by mutually different hatching. The p-type regions 31 are disposed in concentric shapes surrounding the periphery of the active region 1 and are apart from one another in a direction of a normal to the concentric shapes. The p-type regions 31 are disposed in descending order of width (width in the direction of the normal) in the direction from the chip center to the chip end and an interval to the adjacent p-type region 31 relatively closer to the chip center is wide.

An innermost one (first second-conductivity-type withstand voltage region) of the p-type regions 31, that is disposed closest to the chip center, is disposed adjacent to the p⁺-type extension portion 22a, and is closer to the chip end than is the p⁺-type extension portion 22a. The innermost one of the p-type regions 31 surrounds an outer-side corner 24b of the bottom of the p-type peripheral region 24 (in other words, an outer-side corner 22b of the bottom of the p⁺-type extension portion 22a). An inner side end of the innermost one of the p-type regions 31 suffices to terminate closer to the chip end than is the gate polysilicon wiring layer 26. The inner side end of the innermost one of the p-type regions 31 may extend closer to the chip center than the outer side end of the p⁺-type extension portion 22a so as to overlap the p⁺-type extension portion 22a and surround an outer-side portion of the bottom of the p⁺-type extension portion 22a.

The p⁻-type regions 32 are disposed apart from one another in concentric shapes surrounding the periphery of the active region 1. The p⁻-type regions 32 are disposed in descending order of width (width in the direction of the normal) in the direction from the chip center to the chip end and an interval to the adjacent p⁻-type region 32 relatively closer to the chip center is wide. A width of an innermost one of the p⁻-type regions 32, that is closest to the chip center, may be wider than a width of the adjacent p⁻-type region 32 relatively closer to the chip center. Portions of the innermost one of the p⁻-type regions 32 are disposed between all the p-type regions 31 that are adjacent to one another, are adjacent to the p-type regions 31 on both sides thereof in the direction of the normal, and surround corners of bottoms of the p-type regions 31.

An inner side end of the innermost one of the p⁻-type regions 32 terminates at the same position as the inner side end of the innermost one of the p-type regions 31, or closer to the chip end than is the inner side end of the innermost one of the p-type regions 31. The innermost one of the p⁻-type regions 32 extends closer to the chip end than is an outermost one of the p-type regions 31, that is closest to the chip end. The p⁻-type regions 32 excluding the innermost one of the p⁻-type regions 32 are disposed closer to the chip end than are the p-type regions 31. The n⁻-type drift region 12 extends between all the p⁻-type regions 32 that are adjacent to one another and is adjacent to the p⁻-type regions 32 on both sides in the direction of the normal.

All the p-type regions 31 and the innermost one of the p⁻-type regions 32 are fixed to a potential of the source electrode 20, via the p-type peripheral region 24. A double-zone JTE structure is configured by the innermost one of the p-type regions 31 (JTE region 30a) and an outer-side portion (JTE region) 30c of the innermost one of the p⁻-type regions 32, said outer-side portion being closer to the chip end than is the outermost one of the p-type regions 31. A spatial modulation region (first spatial modulation region) 30b between the JTE regions 30a, 30c is configured by the innermost one of the p⁻-type regions (third second-conductivity-type withstand voltage regions) 32 and the p-type regions (second second-conductivity-type withstand voltage regions) 31 excluding the JTE region 30a. A spatial modulation region (second spatial modulation region) 30d adjacent to the JTE region 30c and relatively closer to the chip end is configured by the n⁻-type drift region 12 and the p⁻-type regions (fourth second-conductivity-type withstand voltage regions) 32 excluding the innermost one of the p⁻-type regions 32.

The spatial modulation region 30b is formed by repeatedly disposing two small regions (the p-type regions 31 and the p⁻-type regions 32) alternately and adjacently to one another in a predetermined pattern, each of the two small regions having an impurity concentration that is substantially the same as that of the regions (the JTE regions 30a, 30c) adjacent on both sides of the spatial modulation region 30b. The spatial modulation region 30d is formed by repeatedly disposing two small regions (the p⁻-type regions 32 and the n⁻-type drift region 12) alternately and adjacently to one another in a predetermined pattern, each of the two small regions having an impurity concentration that is substantially the same as that of the regions (the JTE region 30c and the n⁻-type drift region 12) adjacent on both sides of the spatial modulation region 30d. Overall spatial impurity concentration distribution of the spatial modulation regions 30b, 30d is determined by the widths and the impurity concentration ratio of the two small regions.

The spatial modulation JTE structure 30 is a structure in which the spatial modulation region 30b is disposed between the JTE regions 30a and 30c that are adjacent to each other and has an impurity concentration distribution that is spatially equivalent an intermediate impurity concentration between the impurity concentrations of the JTE regions 30a and 30c, the spatial modulation region 30d is disposed between the JTE region 30c and a portion of the n⁻-type drift region 12 said portion being adjacent to the JTE region 30c and closer to the chip end than is the JTE region 30c, the spatial modulation region 30d having an impurity concentration distribution that is spatially equivalent to an intermediate impurity concentration between the impurity concentrations of the JTE region 30c and said portion of the n⁻-type drift region 12, whereby an overall p-type impurity concentration of the structure gradually decreases in the direction from the chip center to the chip end. The spatial modulation JTE structure 30 is disposed so as to be embedded in the n⁻-type silicon carbide layer 42a (or the n⁻-type silicon carbide layers 42a, 42b).

In particular, respective upper surfaces of the p-type regions 31 and the p⁻-type regions 32 are at positions (positions closer to the n⁺-type drain region 11) deeper from the front surface of the semiconductor substrate 40 than is an upper surface of the p⁺-type extension portion 22a. The upper surfaces of the p-type regions 31 and the upper surfaces of the p⁻-type regions 32 are at positions at substantially a same depth. Positions at substantially the same depth means positions on a same plane parallel to the front surface of the semiconductor substrate 40 within a range including an allowable error due to process variation. For example, depth positions of the respective upper surfaces of the p-type regions 31 and the p$^-$-type regions 32 may be at substantially a same depth as an upper surface of a lower portion (portion facing the n$^+$-type drain region 11) 52 (refer to later-described FIGS. 3 to 5) of the p$^+$-type extension portion 22a.

When the respective upper surfaces of the p-type regions 31 and the p$^-$-type regions 32 are positioned at substantially the same depth as the upper surface of the lower portion 52 of the p$^+$-type extension portion 22a, the p-type regions formed in the n$^-$-type silicon carbide layer 42b are only upper portions (portions facing the n$^+$-type source regions 14) of the p$^+$-type regions 22 and an upper portion 53 of the p$^+$-type extension portion 22a (refer to FIGS. 3 to 5), and other p$^+$-type regions having the same impurity concentration as these regions are not formed. Thus, a same ion implantation mask pattern as that for the formation of the upper portion of the p$^+$-type region 122 and the upper portion of the p$^+$-type extension portion 122a of the conventional structure (refer to FIG. 13) may be used to form the upper portions of the p$^+$-type regions 22 and the upper portion 53 of the p$^+$-type extension portion 22a of the first embodiment.

Further, the ion implantation mask pattern for forming the upper portions of the p$^+$-type regions 22 and the upper portion 53 of the p$^+$-type extension portion 22a is a simple pattern compared to the ion implantation mask pattern for forming the lower portions of the p$^+$-type regions 22 and the lower portion 52 of the p$^+$-type extension portion 22a. Therefore, the upper portions of the p$^+$-type regions 22 and the upper portion 53 of the p$^+$-type extension portion 22a may be formed by self-alignment using, as suitable, an ion implantation mask pattern for forming other regions. The upper portions of the p$^+$-type regions 22 and the upper portion 53 of the p$^+$-type extension portion 22a are formed by self-alignment, whereby the number of mask patterns may be reduced.

When the upper portions of the p$^+$-type regions 22 are formed by self-alignment, the outer side end of the p$^+$-type extension portion 22a is positioned at the same position in the direction of the normal as the outer side end of the p$^{++}$-type contact extension portion 15a and the outer side end of the p-type base extension portion 13a. Thus, of these regions, the outer-side corner 22b of the bottom of the p$^+$-type extension portion 22a disposed at a deepest position from the front surface of the semiconductor substrate 40 is a site where electric field concentrates. In the first embodiment, as described hereinafter, the innermost one of the p-type regions 31 may be disposed so as to surround this portion 22b.

The respective bottoms of the p-type regions 31 and the p$^-$-type regions 32 are at positions deeper from the front surface of the semiconductor substrate 40 than is the bottom of the p-type peripheral region 24. The outer-side corner 24b of the bottom of the p-type peripheral region 24 (i.e., the outer-side corner 22b of the bottom of the p$^+$-type extension portion 22a) is surrounded by the innermost one of the p-type regions 31 and is not in contact with the n$^-$-type drift region 12 in the edge termination region 2. Therefore, when the MOSFET is off, local concentration of electric field at the outer-side corner 24b of the bottom of the p-type peripheral region 24 may be suppressed. The bottoms of the p-type regions 31 and the bottoms of the p$^-$-type regions 32 are positioned at substantially the same depth.

Carrier concentration (concentration of activated impurity) of the p-type regions 31 is higher than the carrier concentration of the p-type base extension portion 13a (i.e., the p-type base region 13) and lower than the carrier concentration of the p$^+$-type extension portion 22a (i.e., the p$^+$-type regions 21, 22). In particular, in a general MOSFET in which silicon carbide is used as a semiconductor material, the carrier concentration of the p$^{++}$-type contact extension portion 15a (i.e., the p$^{++}$-type contact regions 15), for example, is about $1 \times 10^{20}/cm^3$. The carrier concentration of the p-type base region 13, for example, is about $1 \times 10^{17}/cm^3$.

The carrier concentration of the p$^+$-type regions 21, 22, for example, is at most about $1 \times 10^{19}/cm^3$ and roughly at least about $10^{18}/cm^3$. The carrier concentration of the p-type regions 31, for example, is on the order of $10^{17}/cm^3$, more specifically, in a range from about $1.4 \times 10^{17}/cm^3$ to less than $1.0 \times 10^{18}/cm^3$. The carrier concentration of the p$^-$-type regions 32 is about the same as the carrier concentration of the p-type base region 13. The carrier concentration of the p-type regions 31 is suitably adjusted, whereby the withstand voltage of the edge termination region 2 may be stably secured at a withstand voltage equal to or greater than the withstand voltage of the active region 1.

Stabilization of the withstand voltage of the edge termination region 2 is maintenance of the withstand voltage of the edge termination region 2 to be free of variation, that is, maintaining the withstand voltage of the edge termination region 2 at the same level as the withstand voltage of the edge termination region 2 in a normal state (charge 0) when an insulating layer is not charged positively or negatively, said withstand voltage being maintained even when the insulating layer (the field oxide film 25 and the interlayer insulating film 19) on the front surface of the semiconductor substrate 40 in the edge termination region 2 becomes positively or negatively charged due to long operation of the silicon carbide semiconductor device 10.

An activation rate of an impurity ion-implanted in a general silicon carbide layer (=[concentration of activated impurity]/[concentration of ion-implanted impurity]×100) is in a range of about 70% to 80% and thus, in each of the regions, the concentration of an impurity ion-implanted therein is higher than the carrier concentration thereof. In particular, for example, in an instance in which the activation rate of an impurity is 70%, to set the carrier concentration of the p-type regions 31 to be at least $1.4 \times 10^{17}/cm^3$, the target impurity concentration of the p-type regions 31 by ion implantation suffices to be at least about $2.0 \times 10^{17}/cm^3$ (roughly about 1.4 times the carrier concentration).

The n$^+$-type channel stopper region 33 is a diffused region formed in a surface region of the n-type silicon carbide layer 42c by ion implantation. The n$^+$-type channel stopper region 33 is provided closer to the chip end than is the spatial modulation JTE structure 30 and is apart from the spatial modulation JTE structure 30. The n$^+$-type channel stopper region 33 is exposed at the front surface of the semiconductor substrate 40 and is in contact with the insulating layer on the front surface of the semiconductor substrate 40 in the edge termination region 2. The n$^+$-type channel stopper region 33 is exposed at the chip end.

Between the n$^+$-type channel stopper region 33 and the p-type peripheral region 24 is the first n-type surface region 34. A bottom of the n$^+$-type channel stopper region 33 may be in contact with the n$^-$-type drift region 12. The n$^+$-type channel stopper region 33 has a floating potential. The front surface of the semiconductor substrate 40 in the edge termination region 2 is free of a field plate (FP) and free of a channel stopper electrode. Instead of the n⁺-type channel stopper region 33, a p⁺-type channel stopper may be provided.

The first n-type surface region 34 is a portion of the n-type silicon carbide layer 42c between the n⁺-type channel stopper region 33 and the p-type peripheral region 24 and has the impurity concentration left as is at the time of epitaxial growth. The first n-type surface region 34 is exposed at the front surface of the semiconductor substrate 40 and is in contact with the insulating film on the front surface of the semiconductor substrate 40. The first n-type surface region 34 faces the entire spatial modulation JTE structure 30 in the depth direction. Between the first n-type surface region 34 and the spatial modulation JTE structure 30 is the n⁻-type drift region 12 of the impurity concentration at the time of epitaxial growth of the silicon carbide layer 42.

The first n-type surface region 34 may be a diffused region formed by ion implantation in a surface region of an epitaxially grown n⁻-type silicon carbide layer that constitutes the n⁻-type drift region 12, instead of the n-type silicon carbide layer 42c. In this instance, the ion implantation depth (thickness) of the first n-type surface region 34 may be shallower than the ion implantation depth of the p⁺⁺-type contact extension portion 15a. A thickness t1 of the first n-type surface region 34, for example, may be in a range of about 0.1 μm to 0.2 μm and may be as thin as possible.

The impurity concentration of the first n-type surface region 34 is higher than the impurity concentration of the n⁻-type drift region 12 and, for example, may be about the same as the impurity concentration of the n-type current spreading region, the impurity concentration of the p-type regions 31 or the p⁻-type regions 32 of the spatial modulation JTE structure 30, etc. Substantially the same impurity concentration means the same impurity concentration within a range that includes an allowable error due to process variation. The impurity concentration of the first n-type surface region 34 is set to be higher than the impurity concentration of the n⁻-type drift region 12, whereby the withstand voltage of the edge termination region may be stabilized.

The spatial modulation JTE structure 30 is disposed apart from the front surface of the semiconductor substrate 40, whereby electric field of the front surface of the semiconductor substrate 40 in the edge termination region 2 is mitigated and reliability of components may be enhanced such as for surface protective films that use, as a material, for example, a polyimide, which has low capability with respect to the high electric field at the front surface of the semiconductor substrate 40. The thinner is the thickness t1 of the n-type region between the front surface of the semiconductor substrate 40 and the spatial modulation JTE structure 30, the higher the withstand voltage of the edge termination region 2 may be set.

Operation of the silicon carbide semiconductor device 10 according to the first embodiment is described. When voltage at least equal to a gate threshold voltage is applied to the gate electrodes 18 while voltage (forward voltage) that is positive with respect to the source electrode 20 is applied to the drain electrode 23, a channel (n-type inversion layer) is formed in a portion of the p-type base region 13 along the trenches 16. As a result, current flows from the n⁺-type drain region 11, through the n⁻-type drift region 12 and the channel, to the n⁺-type source regions 14 and the MOSFET (the silicon carbide semiconductor device 10) turns on.

On the other hand, when voltage less than the gate threshold voltage is applied to the gate electrodes 18 while forward voltage is applied between the source and the drain, pn junctions (main junctions of the active region 1) between the p-type base region 13, the p⁺-type regions 21, 22, the p⁺-type extension portion 22a, and the n⁻-type drift region 12 are reverse biased and the off state of the MOSFET is maintained. Here, a depletion layer spreads in the n⁻-type drift region 12 from the pn junctions, whereby the electric field applied to the gate insulating film 17 at the bottoms of the trenches 16 is mitigated.

Further, when the MOSFET is off, to the extent that the depletion layer spreads in the n⁻-type drift region 12 of the edge termination region 2, in a direction toward the chip end, a predetermined withstand voltage based on dielectric breakdown field strength of silicon carbide and depletion layer width (width in the direction of the normal) is secured. Further, the respective bottoms of the p-type regions 31 and of the p⁻-type regions 32 of the spatial modulation JTE structure 30 are positioned deeper from the front surface of the semiconductor substrate 40 than is the bottom of the p-type peripheral region 24, whereby electric field may be caused to concentrate at the innermost one of the bottoms of the p-type regions 31 of the spatial modulation JTE structure 30, when the MOSFET is off.

The electric field that concentrates at the innermost one of the p-type regions 31 is distributed in the entire spatial modulation JTE structure 30 in a direction toward the chip end and is thereby mitigated. Accordingly, when the MOSFET is off, local concentration of electric field at the outermost peripheral end (hereinafter, main junction end) of the main junction of the active region 1 may be suppressed. The main junction end of the active region 1 is the outer-side corner 24b of the bottom of the p-type peripheral region 24. As a result, avalanche breakdown capability at the main junction end of the active region 1 is enhanced, whereby decreases in the withstand voltage of the edge termination region 2 may be suppressed.

Further, the spatial modulation JTE structure 30 is disposed at a depth position apart from the front surface of the semiconductor substrate 40, whereby electric field of the front surface of the semiconductor substrate 40 when the MOSFET is off may be mitigated. Further, the impurity concentration of the p-type regions 31 of the spatial modulation JTE structure 30 is suitably set, whereby even when the insulating layer on the front surface of the semiconductor substrate 40 in the edge termination region 2 becomes charged due to long operation of the silicon carbide semiconductor device 10, adverse effects of the charge may be mitigated.

Figure 3:
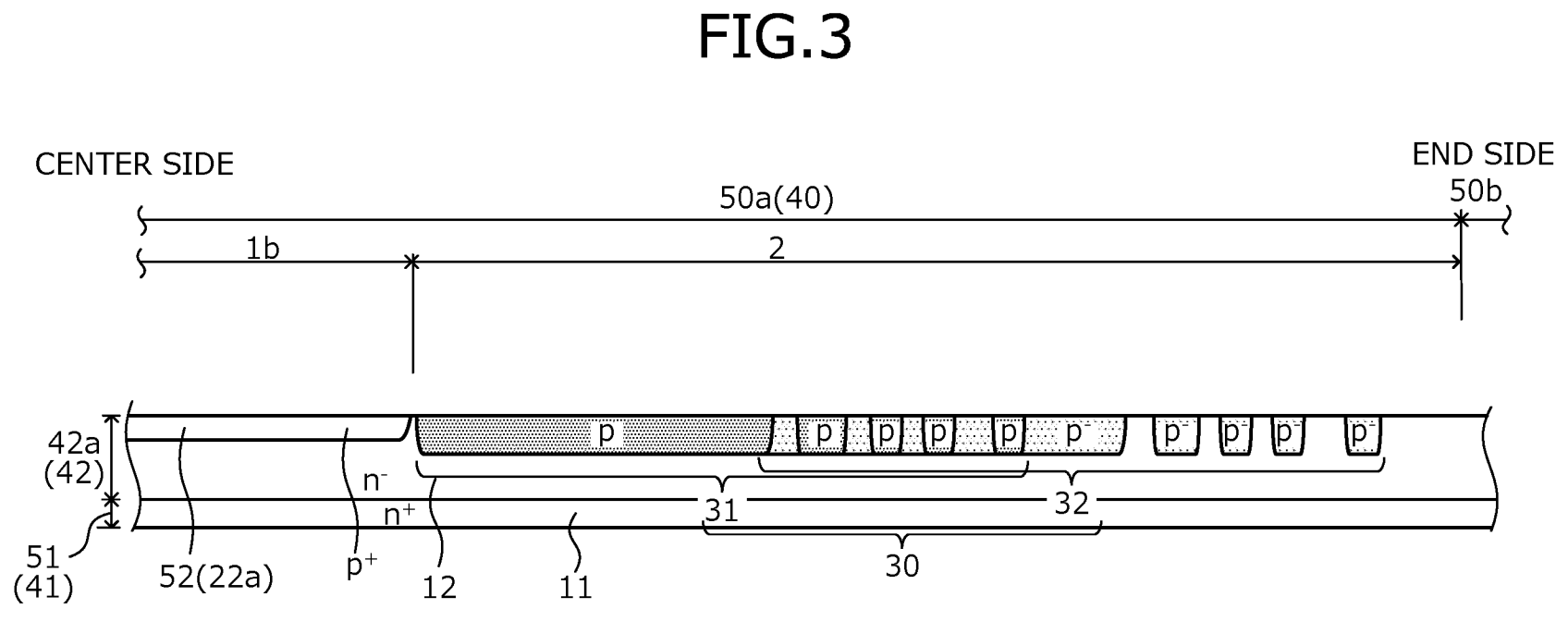
Figure 4:
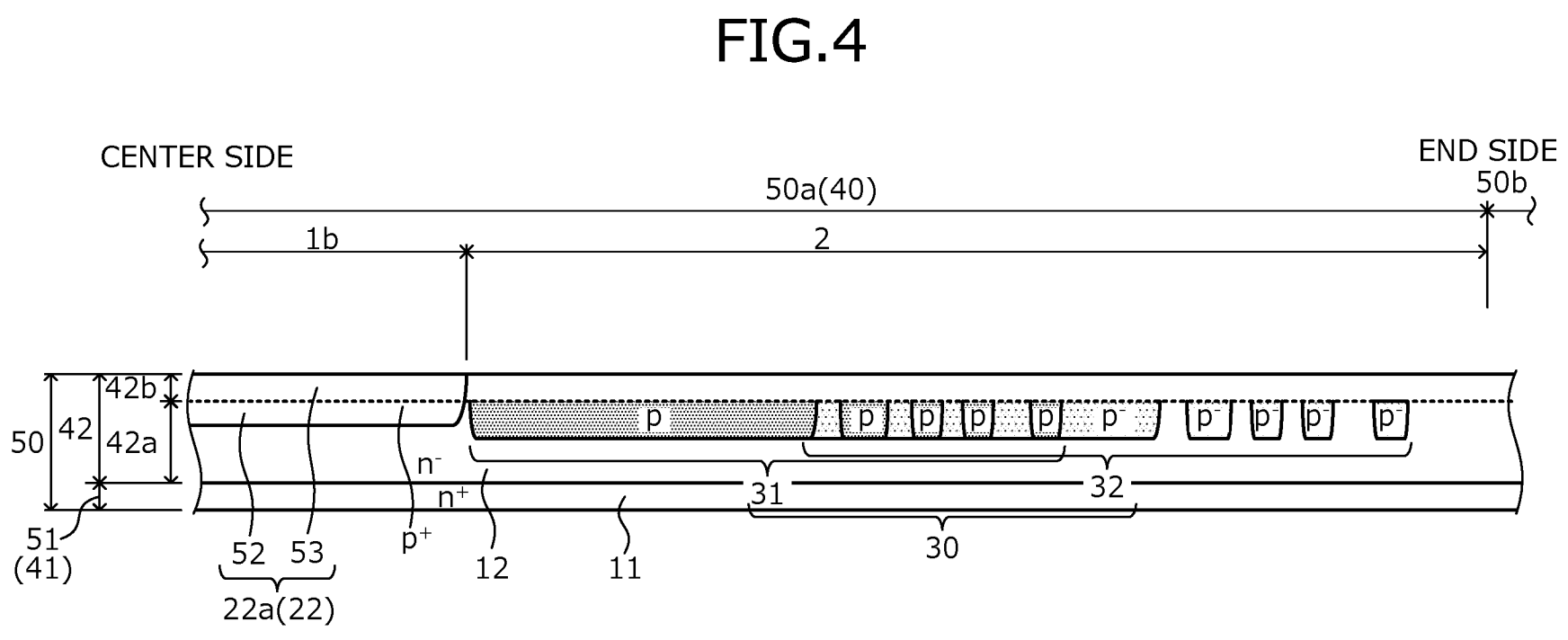
Figure 5:
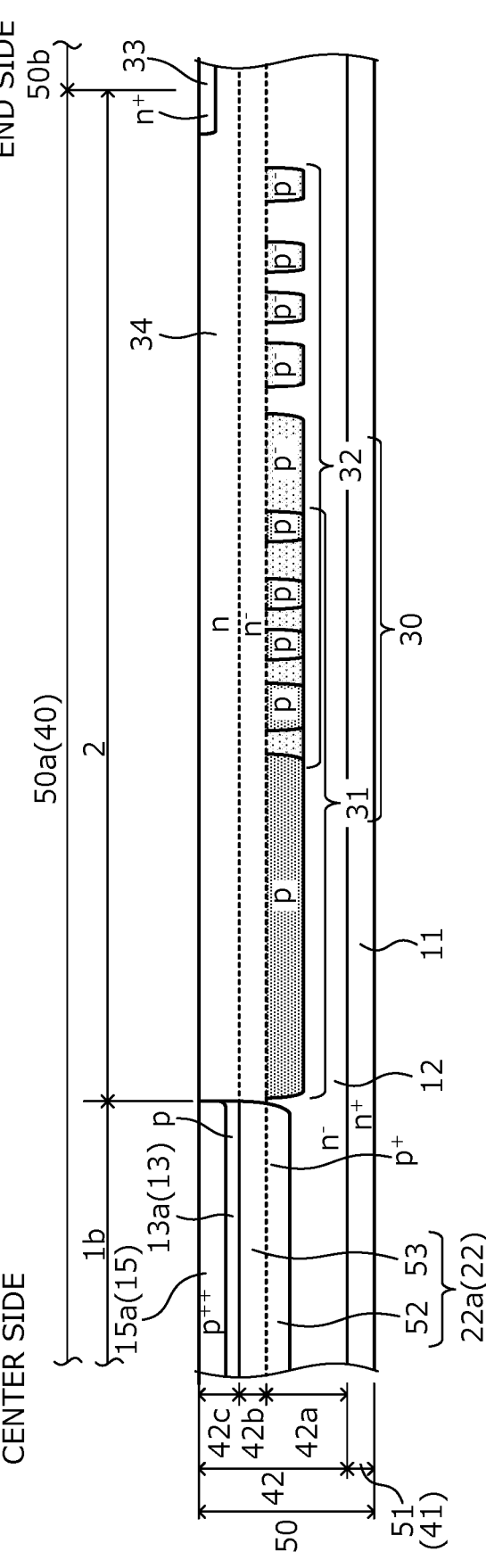
FIG. 5 is a cross-sectional view depicting a state of the silicon carbide semiconductor device according to the first embodiment during manufacture.

Next, a method of manufacturing the silicon carbide semiconductor device 10 according to the first embodiment is described. FIGS. 3, 4, and 5 are cross-sectional views depicting states of the silicon carbide semiconductor device according to the first embodiment during manufacture. FIGS. 3 to 5 depict a single chip region 50a of multiple chip regions 50a of a semiconductor wafer 50. In FIGS. 3 to 5, only the peripheral portion 1b of the active region 1 and the edge termination region 2 of FIG. 2 are depicted. The center portion 1a of the active region 1 is described with reference to FIG. 2. The silicon carbide semiconductor device 10 is fabricated having the same device element structure in each of the chip regions 50a of the semiconductor wafer 50.

Each of the chip regions 50a is a region having a substantially rectangular shape in a plan view and constituting a semiconductor chip (the semiconductor substrate 40) obtained by dicing (cutting) the semiconductor wafer 50 along dicing lines (cutting lines) 50b and is disposed in plural in a center portion of the semiconductor wafer 50, for example, in a matrix-like pattern. The periphery of each of the chip regions 50*a* is surrounded by the dicing lines 50*b*, which have a groove-like shape and are formed at the front surface of the semiconductor wafer 50. The dicing lines 50*b* are formed in a grid-like pattern surrounding the periphery of each of the chip regions 50*a*.

First, as depicted in FIG. 3, the n⁻-type silicon carbide layer 42*a* constituting the n⁻-type drift region 12 is epitaxially grown on a front surface of an n⁺-type starting wafer 51 constituting the n⁺-type starting substrate 41. Next, in each of the chip regions 50*a*, the p⁺-type regions 21 of the center portion 1*a* of the active region 1, the lower portions of the p⁺-type regions 22 of the center portion 1*a* of the active region 1, and the lower portion 52 of the p⁺-type extension portion 22*a* of the peripheral portion 1*b* of the active region 1 are selectively and concurrently formed in surface regions of the n⁻-type silicon carbide layer 42*a*, by photolithography and ion implantation of a p-type impurity.

In the edge termination region 2 of each of the chip regions 50*a*, the multiple p-type regions 31 of the spatial modulation JTE structure 30 are selectively formed in surface regions of the n⁻-type silicon carbide layer 42*a*, by photolithography and ion implantation of a p-type impurity. In the edge termination region 2 of each of the chip regions 50*a*, the multiple p⁻-type regions 32 of the spatial modulation JTE structure 30 are selectively formed in surface regions of the n⁻-type silicon carbide layer 42*a*, by photolithography and ion implantation of a p-type impurity. The p-type regions 31 and the p⁻-type regions 32 are formed deeper than is the lower portion 52 of the p⁺-type extension portion 22*a*.

The p-type regions 31 and the p⁻-type regions 32 are formed at a timing different from that of formation of the diffused regions (the p⁺-type regions 21, the lower portions of the p⁺-type regions 22 and the lower portion 52 of the p⁺-type extension portion 22*a*) formed by ion implantation in the n⁻-type silicon carbide layer 42*a* in the active region 1. The p-type regions 31 are formed at a timing different from that of the p⁻-type regions 32. A sequence in which the formation of the diffused regions in the n⁻-type silicon carbide layer 42*a* in the active region 1, the formation of the p-type regions 31, and the formation of the p⁻-type regions 32 are performed may be suitably changed.

Next, as depicted in FIG. 4, the n⁻-type silicon carbide layer 42*b* constituting the n⁻-type drift region 12 is epitaxially grown on the n⁻-type silicon carbide layer 42*a*. Next, in each of the chip regions 50*a*, the upper portions of the p⁺-type regions 22 and the upper portion 53 of the p⁺-type extension portion 22*a* are selectively formed concurrently in the n⁻-type silicon carbide layer 42*b*, by photolithography and ion implantation of a p-type impurity. Here, the upper portions and the lower portions of the p⁺-type regions 22 are connected in the depth direction. The upper portion 53 and the lower portion 52 of the p⁺-type extension portion 22*a* are connected in the depth direction.

In the edge termination region 2, the n⁻-type silicon carbide layer 42*b* is free of ion implantation (nothing is formed). A portion having the impurity concentration at the time of epitaxial growth and free of ion implantation of the n⁻-type silicon carbide layers 42*a*, 42*b* constitutes the n⁻-type drift region 12. In the edge termination region 2, all the p-type regions 31 and all the p⁻-type regions 32 are covered by the n⁻-type silicon carbide layer 42*b* that is left as the n⁻-type drift region 12. The upper portions of the p⁺-type regions 22 and the upper portion 53 of the p⁺-type extension portion 22*a* may be formed by self-alignment using an ion implantation mask for forming another region.

Next, as depicted in FIG. 5, the n-type silicon carbide layer 42*c* constituting the first n-type surface region 34 is epitaxially grown on the n⁻-type silicon carbide layer 42*b*. By the processes up to here, the semiconductor wafer 50 that has a predetermined thickness and in which the silicon carbide layer 42 (42*a* to 42*c*) of an n-type is stacked on the n⁺-type starting wafer 51 is completed. In an instance in which the n-type current spreading region (not depicted) is formed, the lower portions and the upper portions of the n-type current spreading region suffice to be formed in the n⁻-type silicon carbide layers 42*a*, 42*b*, respectively, spanning the entire active region 1, for each epitaxial growth of the n⁻-type silicon carbide layers 42*a*, 42*b*.

Next, in the active region 1 of each of the chip regions 50*a*, the p-type base region 13 and the p-type base extension portion 13*a* are formed concurrently in the n-type silicon carbide layer 42*c*, by photolithography and ion implantation of a p-type impurity. The p-type base region 13 and the p-type base extension portion 13*a* are the p⁺-type regions 22 and the p⁺-type extension portion 22*a*, respectively, in the depth direction. In the active region 1 of each of the chip regions 50*a*, the n⁺-type source regions 14 are selectively formed in surface regions of the n-type silicon carbide layer 42*c*, by photolithography and ion implantation of an n-type impurity.

In the active region 1 of each of the chip regions 50*a*, the p⁺⁺-type contact regions 15 and the p⁺⁺-type contact extension portion 15*a* are selectively formed concurrently in surface regions of the n-type silicon carbide layer 42*c*, by photolithography and ion implantation of a p-type impurity. As a result, in the peripheral portion 1*b* of the active region 1 of each of the chip regions 50*a*, in a region between the front surface of the semiconductor wafer 50 and the n⁻-type drift region 12, the p-type peripheral region 24 is formed by the p⁺⁺-type contact extension portion 15*a*, the p-type base extension portion 13*a*, and the p⁺-type extension portion 22*a*.

In the edge termination region 2 of each of the chip regions 50*a*, the n⁺-type channel stopper region 33 is selectively formed by photolithography and ion implantation of an n-type impurity in surface regions of the n-type silicon carbide layer 42*c* so as to straddle respective ends of the chip regions 50*a* that are adjacent to one another. The n⁺-type channel stopper region 33 may be formed concurrently with the n⁺-type source regions 14. A portion of the n-type silicon carbide layer 42*c* free of ion implantation and having the same impurity concentration as that during the epitaxial growth thereof constitutes the first n-type surface region 34.

Instead of the n-type silicon carbide layer 42*c*, an n⁻-type silicon carbide layer constituting the n⁻-type drift region 12 may be epitaxially grown and the first n-type surface region 34 may be formed by ion-implanting an n-type impurity in the n⁻-type silicon carbide layer. Next, a heat treatment for activating the impurities ion-implanted in the silicon carbide layer 42 is performed. The heat treatment for activating the impurities may be performed each time an impurity is ion-implanted in the silicon carbide layers 42*a* to 42*c*.

Next, by a general method, the trenches 16, the gate insulating film 17, and the gate electrodes 18 are formed in the center portion 1*a* of the active region 1 of each of the chip regions 50*a*. By a general method, the field oxide film 25 and the gate polysilicon wiring layer 26 are formed in the peripheral portion 1*b* of the active region 1 of each of the chip regions 50*a*. The gate electrodes 18 and the gate polysilicon wiring layer 26 may be formed concurrently. Next, the interlayer insulating film 19 is at the entire front surface of the semiconductor wafer 50.

Next, the source electrode 20, the gate pad, the gate metal wiring layer (not depicted), a passivation film (surface protecting film, not depicted), and the drain electrode 23 are formed, by a general method. Next, portions of the passivation film on the dicing lines 50b are removed. Thereafter, the semiconductor wafer 50 is diced along the dicing lines 50b, whereby each of the chip regions 50a is separated into an individual semiconductor chip (the semiconductor substrate 40) and the silicon carbide semiconductor device 10 depicted in FIGS. 1 and 2 is completed.

As described above, according to the first embodiment, in the edge termination region, the spatial modulation JTE structure is provided as a voltage withstanding structure. The spatial modulation JTE structure has an upper surface positioned at a depth to be separate from the front surface of the semiconductor substrate and is disposed so as to be embedded in the n⁻-type silicon carbide layer configuring the n⁻-type drift region. As a result, electric field of the front surface of the semiconductor substrate is mitigated and application of electric field to portions having a low tolerance to the high electric field on the front surface of the semiconductor substrate is suppressed, thereby enabling reliability to be enhanced. Further, withstand voltage variation due to charge accumulated in the insulating layer on the front surface of the semiconductor substrate as consequence of long operation of the silicon carbide semiconductor device is suppressed.

Further, the bottom of the spatial modulation JTE structure is positioned deeper from the front surface of the semiconductor substrate than is the bottom of the p-type peripheral portion of the peripheral portion of the active region. Thus, near the main junction end of the active region, the innermost p-type region of the spatial modulation JTE structure is disposed deepest at a position closest to the n⁺-type drain region. The innermost p-type region of the spatial modulation JTE structure surrounds the outer-side corner (main junction end of the active region) of the bottom of the p-type peripheral portion. As a result, when the silicon carbide semiconductor device is off, electric field may be caused to concentrate in the bottom of the innermost p-type region of the spatial modulation JTE structure and the electric field concentrated in the bottom of the p-type region is distributed in the entire spatial modulation JTE structure in a direction toward the chip end and is thereby mitigated.

Accordingly, even when the outer end of the p-type peripheral portion of the peripheral portion of the active region is a face substantially orthogonal to the front surface of the semiconductor substrate for the entire region in the depth direction, an occurrence of avalanche breakdown at the outer-side corner of the bottom of the p-type peripheral portion (main junction end of the active region) may be suppressed by the spatial modulation JTE structure. As a result, decreases in the withstand voltage of the edge termination region may be suppressed and the withstand voltage of the edge termination region may be suppressed from becoming lower than the withstand voltage of the active region. Thus, the withstand voltage of the silicon carbide semiconductor device overall may be determined by the withstand voltage of the active region and reliability may be enhanced.

Further, according to the first embodiment, ion implantation is suitably performed for each stage of epitaxial growth of the n⁻-type silicon carbide layer constituting the n⁻-type drift region, whereby the device element structure of the active region is formed. At this time, without changing the method of forming the device element structure of the active region, in the edge termination region, the spatial modulation JTE structure may be easily formed by suitably performing ion implantation in the n⁻-type silicon carbide layer that is positioned at the same depth as the spatial modulation JTE structure. Further, at a timing different from that of the formation of the p-type regions of the active region, p-type regions having an impurity concentration different from that of said p-type regions of the active region are formed, whereby the spatial modulation JTE structure may be configured.

Further, the position in the direction of the normal, the width in the direction of the normal, the thickness, and the depth position are suitably adjusted for the p-type regions configuring the spatial modulation JTE structure, whereby a predetermined withstand voltage of the edge termination region may be ensured. For the p-type regions configuring the spatial modulation JTE structure, the position in the direction of the normal and the width in the direction of the normal may be easily adjusted by suitably setting the ion implantation mask, while the thickness and the depth position may be easily adjusted by suitably performing ion implantation in the n⁻-type silicon carbide layer that is positioned at the same depth as the spatial modulation JTE structure. Thus, a highly reliable silicon carbide semiconductor device that may be easily formed and that has a voltage withstanding structure capable of stably ensuring a predetermined withstand voltage may be provided.

Figure 6:
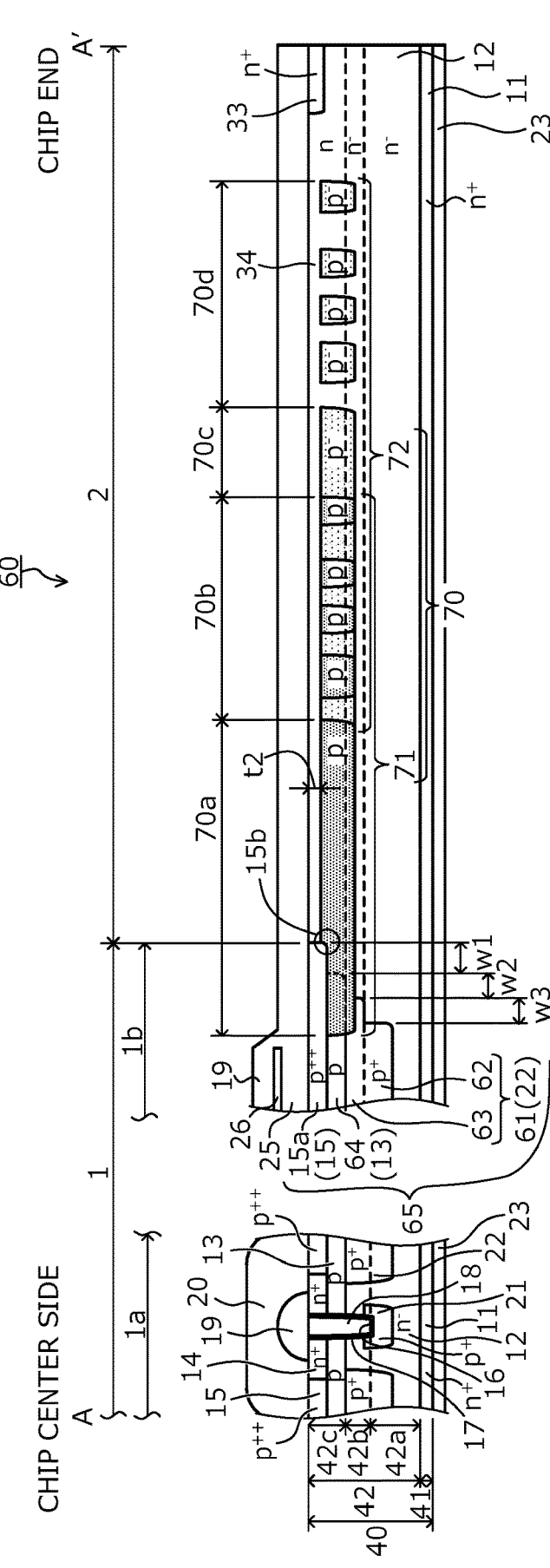
FIG. 6 is a cross-sectional view of a structure of a silicon carbide semiconductor device according to a second embodiment.

Next, a structure of a silicon carbide semiconductor device according to a second embodiment is described. FIG. 6 is a cross-sectional view of the structure of the silicon carbide semiconductor device according to the second embodiment. A layout of a silicon carbide semiconductor device 60 according to the second embodiment is similar to that depicted in FIG. 1, when viewed from the front side of the semiconductor substrate 40. FIG. 6 depicts a cross-sectional view of the structure along cutting line A-A' in FIG. 1. The silicon carbide semiconductor device 60 according to the second embodiment differs from the silicon carbide semiconductor device 10 according to the first embodiment (refer to FIG. 2) on the following two points.

The first difference is that an outer end of a p-type peripheral portion 65 of the peripheral portion 1b of the active region 1 has a step structure with multiple steps that with increasing distance thereof from the front surface of the semiconductor substrate 40 in the depth direction, are recessed stepwise predetermined widths w1, w2, w3 in a direction from the chip end to the chip center. The p-type peripheral portion 65 is configured by the p⁺⁺-type contact extension portion 15a, a p-type base extension portion 64, and a p⁺-type extension portion 61 that are adjacent to one another in the depth direction, between the front surface of the semiconductor substrate 40 and the n⁻-type drift region 12. An outer end of the p⁺⁺-type contact extension portion 15a is positioned at the border between the active region 1 and the edge termination region 2.

An outer end of the p-type base extension portion 64 terminates closer to the chip center than does the outer end of the p⁺⁺-type contact extension portion 15a. An outer end of the upper portion 63 of the p⁺-type extension portion 61 terminates closer to the chip center than does the outer end of the p-type base extension portion 64. An outer end of a lower portion 62 of the p⁺-type extension portion 61 terminates closer to the chip center than does the outer end of the upper portion 63 of the p⁺-type extension portion 61. Other than the positions of the outer end of the p-type base extension portion 64 and the outer end of the p⁺-type extension portion 61, the configuration is correspondingly similar to the p-type base extension portion 13a and the p+-type extension portion 22a of the first embodiment.

The widths w1, w2, w3 of the steps of the outer end of the p-type base extension portion 64, for example, may be at least about 2 μm. The widths w1, w2, w3 of the steps of the outer end of the p-type base extension portion 64 are, respectively, a width in the direction of the normal from the outer end of the p++-type contact extension portion 15a to the outer end of the p-type base extension portion 64, a width in the direction of the normal from the outer end of the p-type base extension portion 64 to the outer end of the upper portion 63 of the p+-type extension portion 61, and a width in the direction of the normal from the outer end of the upper portion 63 of the p+-type extension portion 61 to the outer end of the lower portion 62 of the p+-type extension portion 61.

The second difference is that depth positions of bottoms of multiple p-type regions 71 and bottoms of multiple p−-type regions 72 configuring a spatial modulation JTE structure 70 are shallower than a depth position of a bottom (i.e., bottom of the p+-type extension portion 61) of the p-type peripheral portion 65. A layout (i.e., positions in the direction of the normal or widths in the direction of the normal) of the p-type regions 71 and the p−-type regions 72 of the spatial modulation JTE structure 70 when viewed from the front side of the semiconductor substrate 40 corresponds to the layout of the p-type regions 31 and the p−-type regions 32 of the spatial modulation JTE structure 30 of the first embodiment.

The spatial modulation JTE structure 70, similarly to the first embodiment, is a structure in which, in the direction from the chip center to the chip end, a JTE region 70a, a spatial modulation region 70b, a JTE region 70c, and a spatial modulation region 70d are disposed sequentially in the direction of the normal and an overall p-type impurity concentration gradually decreases in the direction from the chip center to the chip end the inner side. Other than depth positions of the JTE regions 70a, 70c and the spatial modulation regions 70b, 70d of the spatial modulation JTE structure 70, the configuration is correspondingly similar to the JTE regions 30a, 30c and the spatial modulation regions 30b, 30d of the spatial modulation JTE structure 30 of the first embodiment.

The spatial modulation JTE structure 70 is disposed in the n-type silicon carbide layer 42c or straddling the n-type silicon carbide layer 42c and the n−-type silicon carbide layer 42b, so as to be embedded in the silicon carbide layer 42. The p-type regions 71 and the p−-type regions 72 of the spatial modulation JTE structure 70 are disposed in the edge termination region 2 at depth positions apart from the front surface of the semiconductor substrate 40 and bottoms thereof are positioned at a depth shallower from the front surface of the semiconductor substrate 40 than is a bottom of the p-type peripheral portion 65. An innermost one of the p-type regions 71 extends toward the chip center so that a bottom thereof is in contact with the p-type peripheral portion 65.

As described above, in the peripheral portion 1b of the active region 1, of the p++-type contact extension portion 15a, the p-type base extension portion 64, and the p+-type extension portion 61 that configure the p-type peripheral portion 65, the p++-type contact extension portion 15a that is most superficial on the front side of the semiconductor substrate 40 extends closest to the chip end. By this configuration, an outer-side corner 15b of a bottom of the p++-type contact extension portion 15a is where electric field concentrates and the electric field applied to this portion 15b is mitigated by the spatial modulation JTE structure 70 that is adjacent to an outer side of the outer-side corner 15b of the bottom of the p++-type contact extension portion 15a.

In particular, the innermost one of the p-type regions 71 is disposed adjacent to and on the outer side of the p++-type contact extension portion 15a and the outer side of the p-type base extension portion 64. The innermost one of the p-type regions 71 is in contact with the outer-side corner 15b of the bottom of the p++-type contact extension portion 15a or surrounds the outer-side corner 15b of the bottom of the p++-type contact extension portion 15a. Electric field applied to the outer-side corner 15b of the bottom of the p++-type contact extension portion 15a is distributed in the entire spatial modulation JTE structure 70 in direction from the innermost one of the p-type regions 71 adjacent on the outer side thereof to the chip end.

The innermost one of the p-type regions 71 may further surround of an outer-side corner of a bottom of the p-type base extension portion 64. In this instance, the innermost one of the p-type regions 71 is disposed on the respective outer sides of the p++-type contact extension portion 15a, the p-type base extension portion 64, and the p+-type extension portion 61, adjacently thereto. An inner side end of the innermost one of the p-type regions 71 may extend toward the chip center so as to overlap the p++-type contact extension portion 15a and the p-type base extension portion 64 (and additionally, the p+-type extension portion 61 in an instance in which the innermost one of the p-type regions 71 surrounds the outer-side corner of the bottom of the p-type base extension portion 64).

Respective upper surfaces of the p-type regions 71 and the p−-type regions 72 are positioned at the same depth as the bottom of the p++-type contact extension portion 15a (i.e., flush with the bottom of the p++-type contact extension portion 15a), or are positioned apart from the front surface of the semiconductor substrate 40, at a depth shallower from the front surface of the semiconductor substrate 40 than is the bottom of the p++-type contact extension portion 15a. The depth position of the upper surfaces of the p-type regions 71 and the depth position of upper surfaces of the p−-type regions 72 are substantially the same. Between the semiconductor substrate 40 and the spatial modulation JTE structure 70 is the first n-type surface region 34.

The impurity concentration of a portion of the p-type peripheral portion 65 deeper from the front surface of the semiconductor substrate 40 than is the spatial modulation JTE structure 70, for example, is at most about $1 \times 10^{19}/cm^3$. In particular, the respective bottoms of the p-type regions 71 and the p−-type regions 72 are positioned shallower from the front surface of the semiconductor substrate 40 than is the bottom of the p-type peripheral portion 65 (i.e., the bottom of the lower portion 62 of the p+-type extension portion 61). An outer-side corner of the bottom of the lower portion 62 of the p+-type extension portion 61 is surrounded by the n−-type drift region 12.

The respective bottoms of the p-type regions 71 and the p−-type regions 72 may be positioned shallower from the front surface of the semiconductor substrate 40 than is a bottom of the upper portion 63 of the p+-type extension portion 61. In this instance, an outer-side corner of the bottom of the upper portion 63 of the p+-type extension portion 61 is further surrounded by the n−-type drift region 12. The respective bottoms of the p-type regions 71 and the p−-type regions 72 may be positioned shallower from the front surface of the semiconductor substrate 40 than the bottom of the p-type base extension portion 64. In this instance, the outer-side corner of the bottom of the p-type base extension portion 64 is further surrounded by the n⁻-type drift region 12.

The depth position of the bottoms of the p-type regions 71 and depth position of the bottoms of the p⁻-type regions 72 are substantially the same. As described above, while the lower portion 62 of the p⁺-type extension portion 61 is positioned deeper from the front surface of the semiconductor substrate 40 than is the spatial modulation JTE structure 70, the lower portion 62 terminates closer to the chip center than does the outer end of the upper portion 63 of the p⁺-type extension portion 61, the upper portion 63 being adjacent to and directly above (on the side facing the semiconductor substrate 40) the lower portion 62. Thus, local application of electric field to the outer-side corner of the bottom of the lower portion 62 of the p⁺-type extension portion 61 may be suppressed.

Even in an instance in which the upper portion 63 of the p⁺-type extension portion 61 is positioned deeper from the front surface of the semiconductor substrate 40 than is the spatial modulation JTE structure 70, as described above, the upper portion 63 of the p⁺-type extension portion 61 terminates closer to the chip center than does the outer end of the p-type base extension portion 64 that is adjacent to and above the upper portion 63 of the p⁺-type extension portion 61. Thus, local application of electric field to the outer-side corner of the bottom of the upper portion 63 of the p⁺-type extension portion 61 may be suppressed.

Even in an instance in which the p-type base extension portion 64 is positioned deeper from the front surface of the semiconductor substrate 40 than is the spatial modulation JTE structure 70, as described above, the p-type base extension portion 64 terminates closer to the chip center than does the outer end of the p⁺⁺-type contact extension portion 15a that is adjacent to and above the p-type base extension portion 64. Thus, local application of electric field to the outer-side corner of the bottom of the p-type base extension portion 64 may be suppressed.

Figure 7:
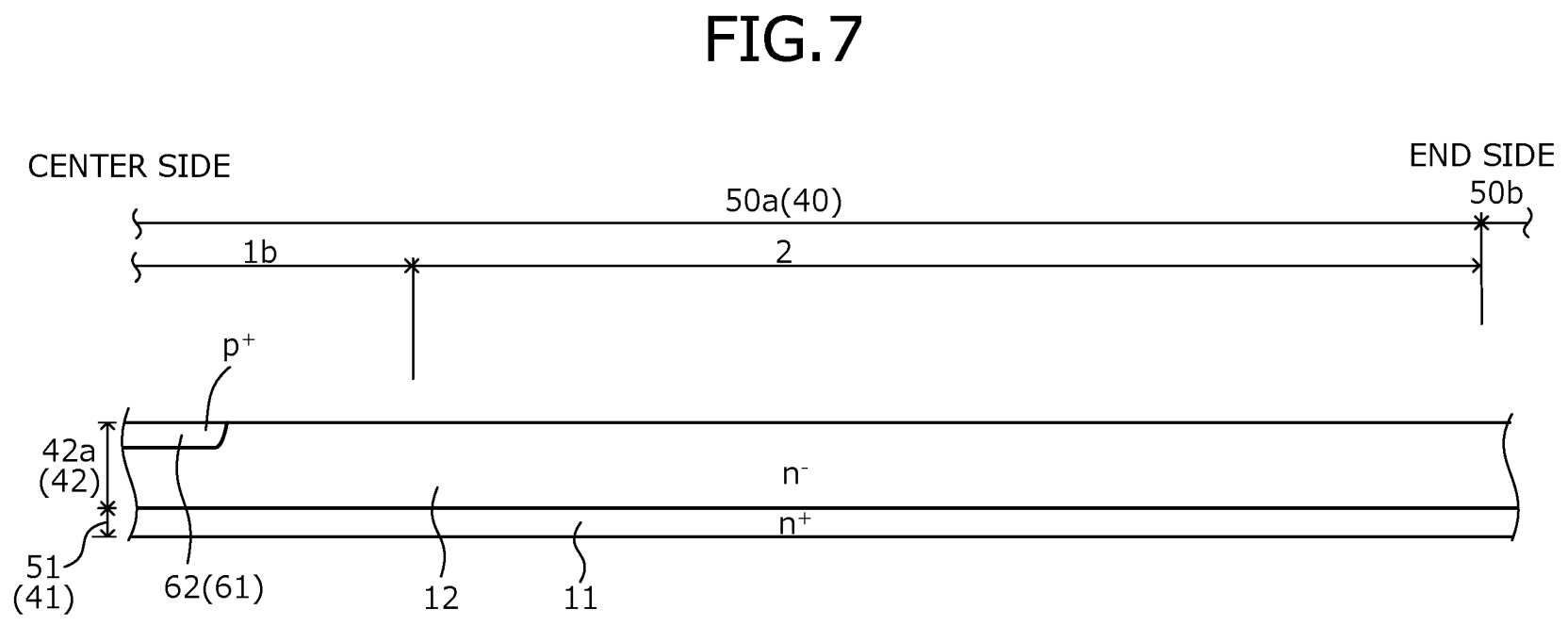
Figure 8:
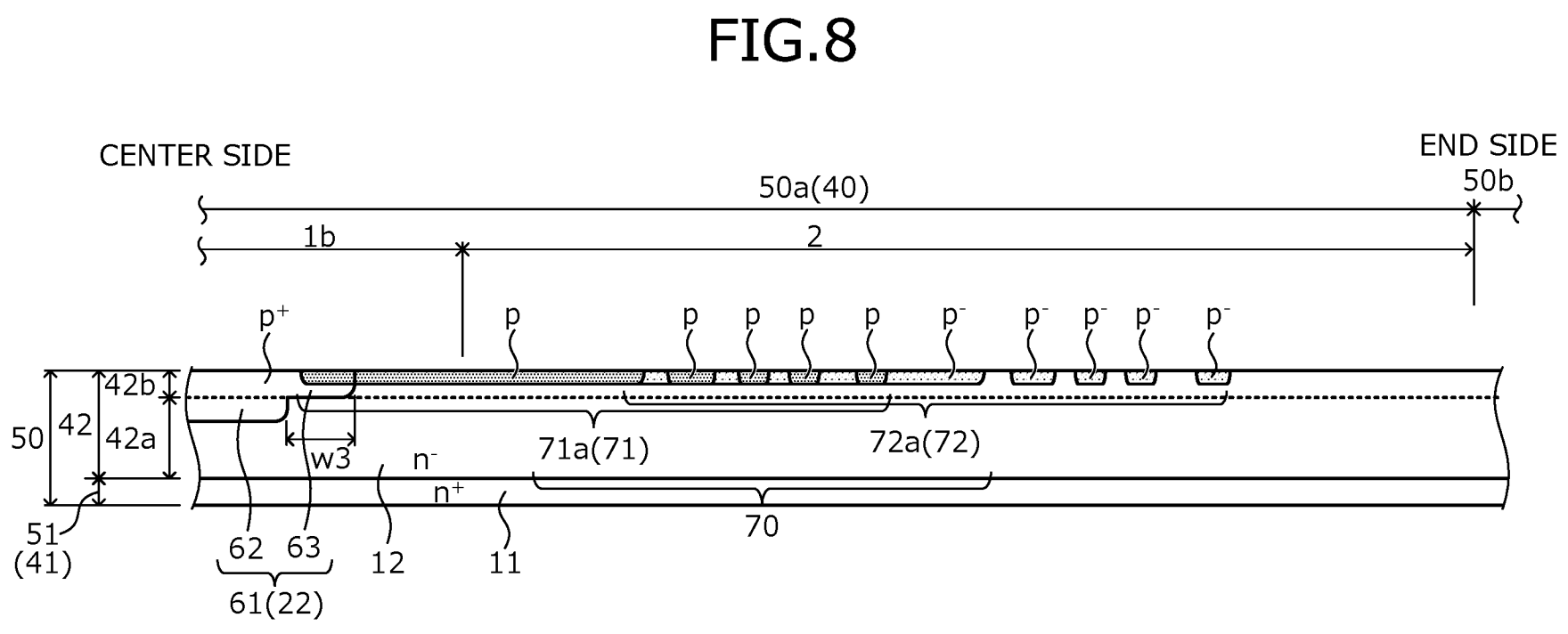
Figure 9:
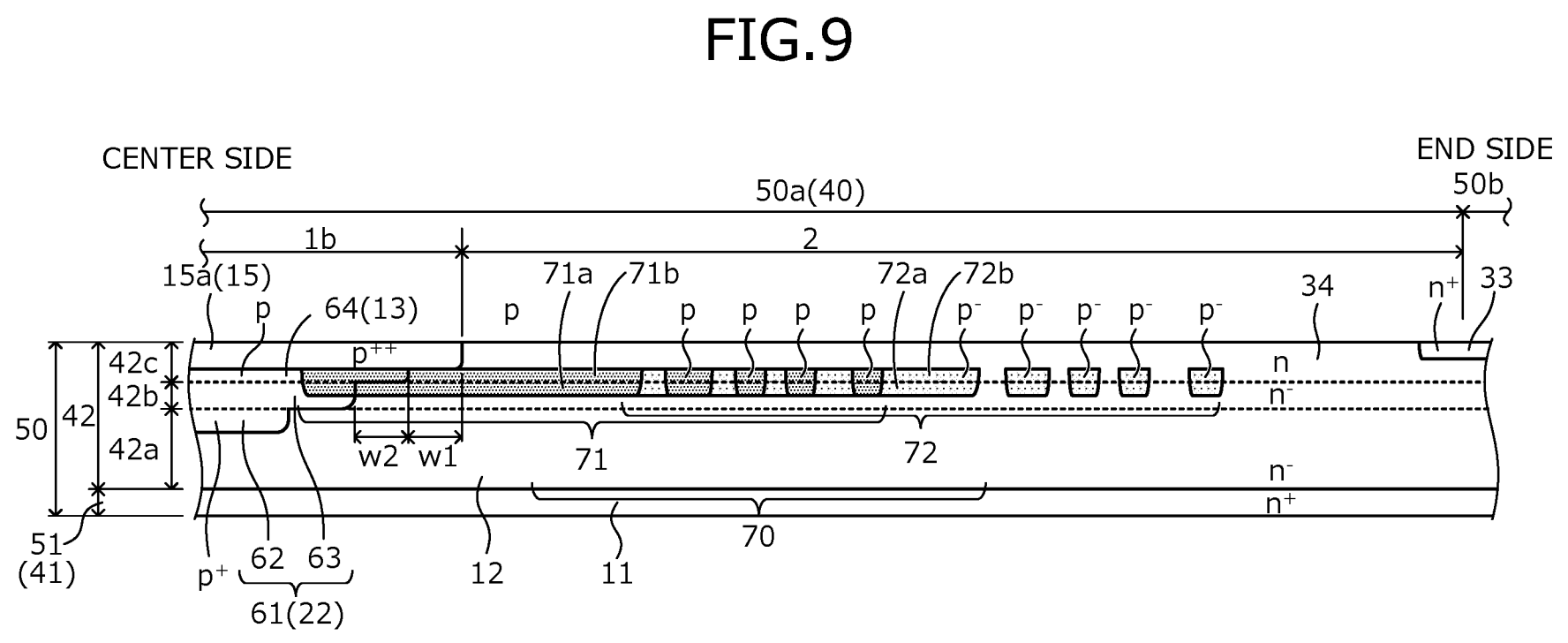

A method of manufacturing the silicon carbide semiconductor device 60 according to the second embodiment is described. FIGS. 7, 8, and 9 are cross-sectional views depicting states of the silicon carbide semiconductor device according to the second embodiment during manufacture. FIGS. 7 to 9 depict one of the chip regions 50a of the semiconductor wafer 50. In FIGS. 7 to 9, the peripheral portion 1b of the active region 1 and the edge termination region 2 in FIG. 6 are depicted. Refer to FIG. 6 regarding the center portion 1a of the active region 1. In each of the chip regions 50a of the semiconductor wafer 50, the silicon carbide semiconductor device 60 is fabricated having the same device element structure in each of the chip regions 50a.

In the method of manufacturing the silicon carbide semiconductor device 60 according to the second embodiment the timing of forming the spatial modulation JTE structure 70 differs from that in the method of manufacturing the silicon carbide semiconductor device 10 according to the first embodiment. Here, the p-type regions 71 and the p⁻-type regions 72 of the spatial modulation JTE structure 70 are positioned so that respective upper surfaces thereof are shallower from the front surface of the semiconductor substrate 40 than is the bottom of the p⁺⁺-type contact extension portion 15a, and so that respective bottoms thereof are deeper from the front surface of the semiconductor substrate 40 than is the bottom of the p-type base extension portion 64 and shallower than the bottom of the upper portion 63 of the p⁺-type extension portion 61.

In particular, as depicted in FIG. 7, similarly to the first embodiment, from the process of epitaxially growing the n⁻-type silicon carbide layer 42a that constitutes the n⁻-type drift region 12 to the process of forming the p⁺-type regions 21 and the lower portions of the p⁺-type regions 22 of the active region 1 in the n⁻-type silicon carbide layer 42a are sequentially performed. Further, concurrently with the p⁺-type regions 21 and the lower portions of the p⁺-type regions 22, the lower portion 62 of the p⁺-type extension portion 61 are formed in the n⁻-type silicon carbide layer 42a. The outer end of the lower portion 62 of the p⁺-type extension portion 61 terminates closer to the chip center than is the border between the active region 1 and the edge termination region 2. In the edge termination region 2, the n⁻-type silicon carbide layer 42a is free of ion implantation (nothing is formed).

Next, as depicted in FIG. 8, the process from epitaxially growing the n⁻-type silicon carbide layer 42b constituting the n⁻-type drift region 12 to the process of forming the upper portions of the p⁺-type regions 22 in the n⁻-type silicon carbide layer 42b in the active region 1 are sequentially performed. Further, concurrently with the upper portions of the p⁺-type regions 22, the upper portion 63 of the p⁺-type extension portion 61 is formed in the n⁻-type silicon carbide layer 42b. The outer end of the upper portion 63 of the p⁺-type extension portion 61 extends (extension portion) closer to the chip end than does the outer end of the lower portion 62 of the p⁺-type extension portion 61, thereby forming the outer end of the lower portion 62 of the p⁺-type extension portion 61 to be recessed one step of the predetermined width w3 in a direction toward the chip center.

Further, in the edge termination region 2 of each of the chip regions 50a, respective lower portions 71a of the p-type regions 71 of the spatial modulation JTE structure 70 are selectively formed in surface regions of the n⁻-type silicon carbide layer 42b, by photolithography and ion implantation of a p-type impurity. In the edge termination region 2 of each of the chip regions 50a, respective lower portions 72a of the p⁻-type regions 72 of the spatial modulation JTE structure 70 are selectively formed in surface regions of the n⁻-type silicon carbide layer 42b, by photolithography and ion implantation of a p-type impurity.

The lower portions 71a of the p-type regions 71 and the lower portions 72a of the p⁻-type regions 72 are formed at a timing different from that of the diffused regions formed by ion implantation in the n⁻-type silicon carbide layer 42b in the active region 1, and are shallower than the upper portion 63 of the p⁺-type extension portion 61. The lower portions 71a of the p-type regions 71 are formed at a timing different from that of the lower portions 72a of the p⁻-type regions 72. A sequence in which the formation of the diffused regions in the n⁻-type silicon carbide layer 42b in the active region 1, the formation of the lower portions 71a of the p-type regions 71, and the formation of the lower portions 72a of the p⁻-type regions 72 are performed may be suitably changed.

Next, as depicted in FIG. 9, similarly to the first embodiment, the n-type silicon carbide layer 42c constituting the first n-type surface region 34 is epitaxially grown on the n⁻-type silicon carbide layer 42b, whereby the semiconductor wafer 50 is completed. Next, similarly to the first embodiment, in surface regions of the n-type silicon carbide layer 42c, the p-type base region 13, the p-type base extension portion 13a, the n⁺-type source regions 14, the p⁺⁺-type contact regions 15, and the p⁺⁺-type contact extension portion 15a of the active region 1, and the n⁺-type channel stopper region 33 of the edge termination region 2 are selectively formed.

An outer end of the p-type base extension portion 13a extends (extension portion) closer to the chip end than does the outer end of the upper portion 63 of the p$^+$-type extension portion 61, thereby forming the outer end of the upper portion 63 of the p$^+$-type extension portion 61 to be recessed one step of the predetermined width w2 in a direction toward the chip center. The outer end of the p$^{++}$-type contact extension portion 15a terminates (first extension portion) at the border between the active region 1 and the edge termination region 2, thereby forming the outer end of the p-type base extension portion 13a to be recessed one step of the predetermined width w1 in a direction toward the chip center. A distance from the outer end of the p$^{++}$-type contact extension portion 15a to the outer end of the p-type base extension portion 64 is assumed to be the predetermined width w1.

As a result, in the peripheral portion 1b of the active region 1 of each of the chip regions 50a, between the front surface of the semiconductor wafer 50 and the n$^-$-type drift region 12, the p-type peripheral portion 65 is formed by the p$^{++}$-type contact extension portion 15a, the p-type base extension portion 64, and the p$^+$-type extension portion 6. The outer end of the p-type peripheral portion 65 is formed having steps that with increasing distance thereof from the front surface of the semiconductor substrate 40 in the depth direction, are recessed stepwise the predetermined widths w1, w2, w3 in a direction toward the chip center.

Further, by photolithography and ion implantation of a p-type impurity, in the edge termination region 2 of each of the chip regions 50a, respective upper portions 71b of the p-type regions 71 of the spatial modulation JTE structure 70 are selectively formed in the n-type silicon carbide layer 42c. The outer-side corner of the bottom of the p$^{++}$-type contact extension portion 15a is surrounded by the upper portion 71b of the innermost one of the p-type regions 71. In the edge termination region 2 of each of the chip regions 50a, respective upper portions 72b of the p$^-$-type regions 72 of the spatial modulation JTE structure 70 are selectively formed in the n-type silicon carbide layer 42c, by photolithography and ion implantation of a p-type impurity.

The upper portions 71b of the p-type regions 71 and the upper portions 72b of the p$^-$-type regions 72 of the spatial modulation JTE structure 70 are formed at depth positions apart from the front surface of the semiconductor wafer 50 and are, respectively, connected to the lower portions 71a of the p-type regions 71 and the lower portions 72a of the p$^-$-type regions 72 therebelow in the depth direction. The n-type silicon carbide layer 42c has a portion that constitutes the first n-type surface region 34, said portion being between the front surface of the semiconductor substrate 40 and the spatial modulation JTE structure 70, being free of ion implantation, and having a predetermined thickness t2 and an impurity concentration that is the same as that at the time of epitaxial growth of the n-type silicon carbide layer 42c.

The upper portions 71b of the p-type regions 71 and the upper portions 72b of the p$^-$-type regions 72 are formed at a timing different from that of formation of the diffused regions formed by ion implantation in the n-type silicon carbide layer 42c in the active region 1. The upper portions 71b of the p-type regions 71 are formed at a different timing from that of the upper portions 72b of the p$^-$-type regions 72. A sequence in which the formation of the diffused region in the n-type silicon carbide layer 42c in the active region 1, the formation of the upper portions 71b of the p-type regions 71, and the formation of the upper portions 72b of the p$^-$-type regions 72 are performed may be suitably changed.

Thereafter, similarly to the first embodiment, a heat treatment for activating the impurities and subsequent processes are sequentially performed, whereby the silicon carbide semiconductor device 60 depicted in FIG. 6 is completed.

As described above, according to the second embodiment, the outer end of the p-type peripheral portion in the peripheral portion of the active region is formed having steps that with increasing distance thereof from the front surface of the semiconductor substrate, are recessed stepwise predetermined widths in a direction toward the chip center, whereby even when the bottom of the spatial modulation JTE structure is positioned shallower from the front surface of the semiconductor substrate than is the bottom of the p-type peripheral portion, effects similar to those of the first embodiment may be obtained.

Figure 10:
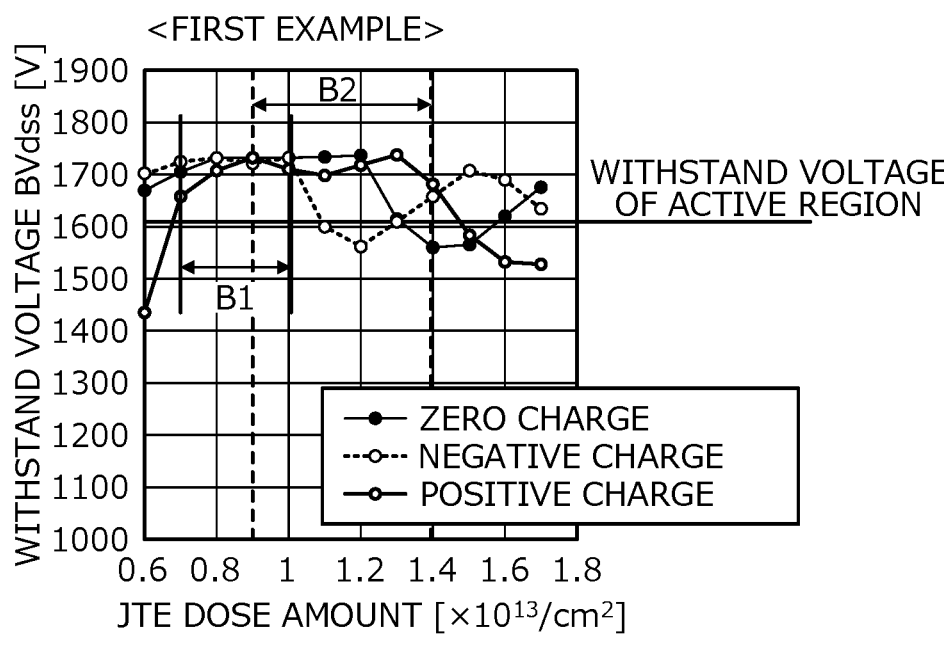
FIG. 10 is a characteristics diagram depicting results of simulation of withstand voltage characteristics for a first example.
Figure 11:
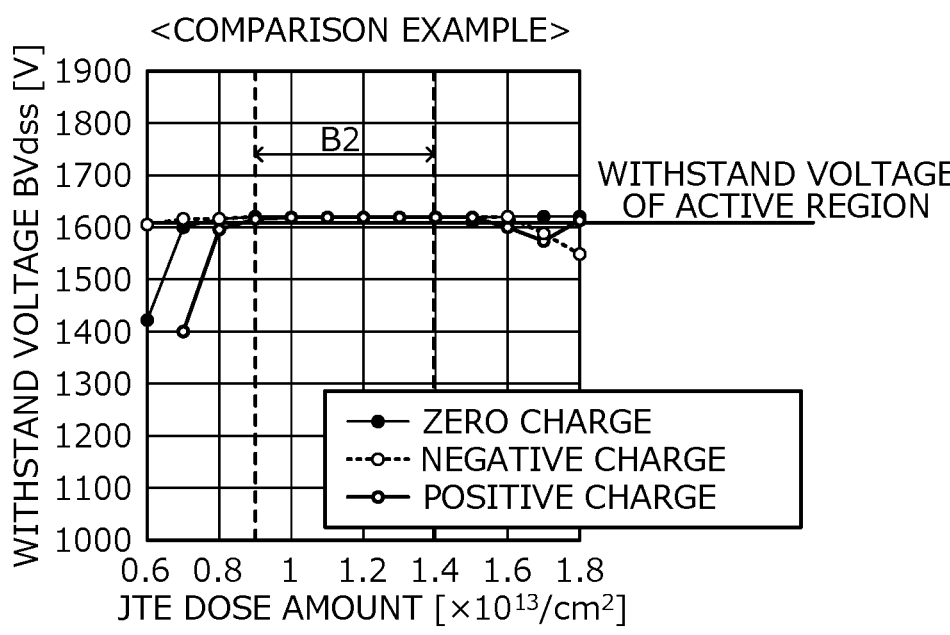
FIG. 11 is a characteristics diagram depicting results of simulation of withstand voltage characteristics for a comparison example.

Withstand voltage characteristics of the silicon carbide semiconductor device 60 according to the second embodiment described above were verified (hereinafter, first example, refer to FIG. 6). FIGS. 10 and 11 are characteristics diagrams depicting results of simulation of the withstand voltage characteristics for the first example and a comparison example, respectively. In FIGS. 10 and 11, horizontal axes indicate ion implantation dose amount (JTE dose amount) of aluminum (Al) for forming the p-type regions 71, 201 of the spatial modulation JTE structure 70, 200 of the first example and the comparison example, respectively. In FIGS. 10 and 11, vertical axes indicate the withstand voltage of the edge termination region 2 of the first example and the comparison example, respectively.

Figure 12:
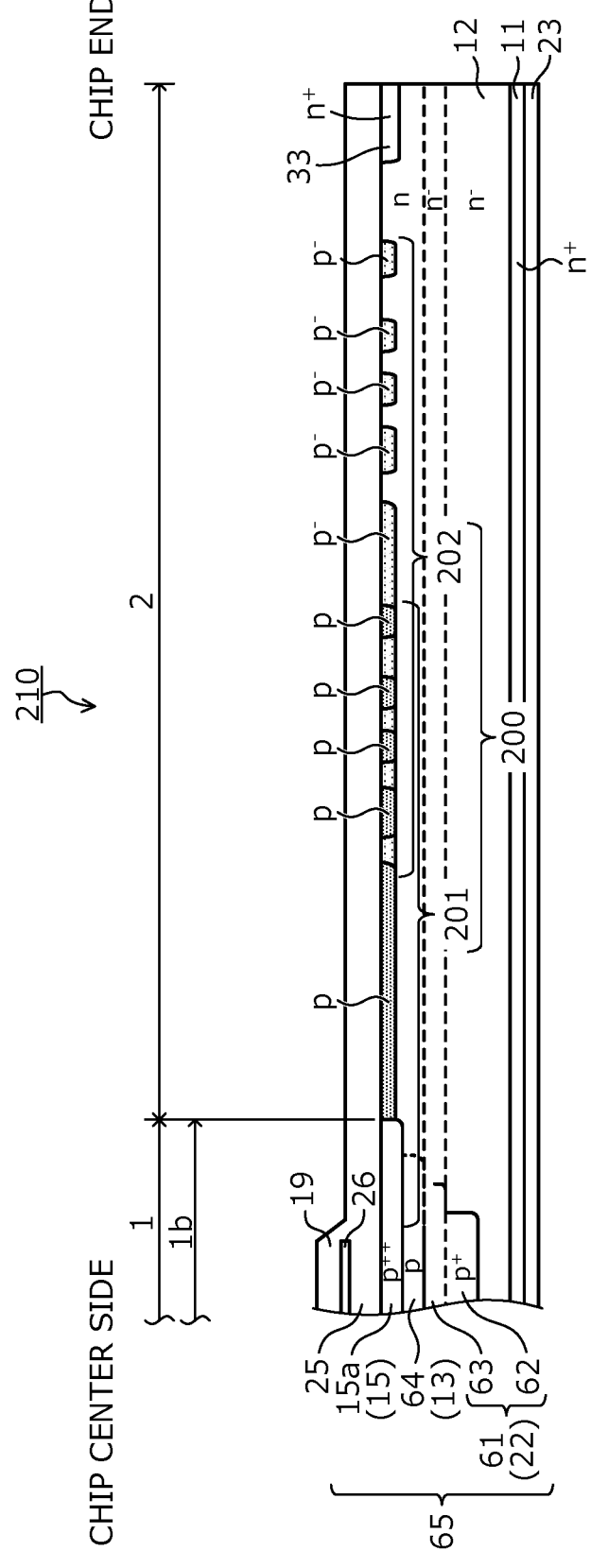
FIG. 12 is a cross-sectional view depicting a voltage withstanding structure of the comparison example.

FIGS. 10 and 11 show results for three instances including an instance in which the insulating layer (the field oxide film 25 and the interlayer insulating film 19) on the front surface of the semiconductor substrate 40 is positively charged (positive charge is accumulated therein) due to long operation of the MOSFET (the first example and the comparison example), an instance in which the insulating layer is negatively charged (negative charge is accumulated therein) due to long operation of the MOSFET, and an instance of a normal state in which the insulating layer is not charged (zero charge). FIG. 12 is a cross-sectional view depicting the voltage withstanding structure of the comparison example.

In the first example, the upper surface (respective upper surfaces of the p-type regions 71 and the p$^-$-type regions 72) of the spatial modulation JTE structure 70 is positioned at the same depth as the bottom of the p$^{++}$-type contact extension portion 15a, the bottom of the spatial modulation JTE structure 70 is positioned shallower from the front surface of the semiconductor substrate 40 than is the bottom of the lower portion 62 of the p$^+$-type extension portion 61 and deeper from the front surface of the semiconductor substrate 40 than is the bottom of the p-type base extension portion 64. The withstand voltage of the active region 1 was set to 1600V.

A comparison example 210 depicted in FIG. 12 differs from the first example in that the first n-type surface region 34 is not provided and an upper surface (respective upper surfaces of p-type regions 201 and p$^-$-type regions 202) of a spatial modulation JTE structure 200 is exposed at the front surface of the semiconductor substrate 40. A layout (i.e., positions in the direction of the normal and the widths in the direction of the normal) of the spatial modulation JTE structure 200 of the comparison example 210 when viewed from the front side of the semiconductor substrate 40 is similar to that of the spatial modulation JTE structure 70 of the first example.

The conventional silicon carbide semiconductor device 110 (hereinafter, conventional example, refer to FIG. 13) has the spatial modulation JTE structure 130 whose upper surface (respective upper surfaces of the p-type regions 131 and of the p$^-$-type regions 132) is exposed at the front surface of the semiconductor substrate 140, and due to the p$^{++}$-type contact extension portion 115a, the p-type base extension portion 113a, and the p$^+$-type extension portion 122a of the peripheral portion 101b of the active region 101, the outer end of the p-type peripheral portion is a face that is substantially orthogonal to the front surface of the semiconductor substrate 140.

A layout of the spatial modulation JTE structure 130 of the conventional example when viewed from the front surface of the semiconductor substrate 140 is similar to that of the spatial modulation JTE structure 70 of the first example. While simulation results for the conventional example are not depicted, in the conventional example, it was confirmed that electric field concentrated at the outer-side corner of the bottom 122b (the outer-side corner of the bottom of the p-type peripheral portion) of the p$^+$-type region 122, and the withstand voltage of the edge termination region 102 decreased and became lower than the withstand voltage the active region 101.

On the other hand, from the results depicted in FIG. 11, in the comparison example, it was confirmed that the outer end of the p-type peripheral portion 65 in the peripheral portion 1b of the active region 1 is formed having steps that with increasing distance thereof from the front surface of the semiconductor substrate 40 in the depth direction, are recessed stepwise the widths w1, w2, w3 in a direction toward the chip center, whereby problems arising in the conventional example may be resolved (decrease of the withstand voltage of the edge termination region 2 is suppressed), and the withstand voltage of the edge termination region 2 may be made slightly higher than the withstand voltage of the active region 1. When the carrier concentration of the p-type regions 201 of the spatial modulation JTE structure 200 is in a range B2 of 1×10$^{17}$/cm$^3$ to 2.8×10$^{17}$/cm$^3$, irrespective of whether the insulating layer on the front surface of the semiconductor substrate 40 is charged, the withstand voltage of the edge termination region 2 is stably at least equal to the withstand voltage of the active region 1.

However, in the comparison example, in an instance in which a difference of the withstand voltage of the edge termination region 2 and the withstand voltage of the active region 1 is small, and the withstand voltage of the active region 1 is high due another factor, avalanche breakdown occurs in the edge termination region 2 and the withstand voltage of the edge termination region 2 may become lower than the withstand voltage of the active region 1. Therefore, reliability against avalanche breakdown degrades. A numeric value range of the carrier concentration of the p-type regions 201 of the spatial modulation JTE structure 200 described above is a numeric value range in an instance in which the activation rate of the aluminum ion implanted to form the p-type regions 201 is 100%. Here, the JTE thickness is assumed to be about 0.5 μm and thus, as for the carrier concentration [/cm$^3$] of the p-type regions 201, a value about the same as 2×10$^4$ times the JTE dose amount [/cm$^2$] on the horizontal axis in FIG. 11 is assumed.

In contrast, from the results depicted in FIG. 10, it was confirmed that in the first example, compared to the comparison example, the withstand voltage of the edge termination region 2 may be set to be sufficiently higher than the withstand voltage of the active region 1 and sufficient reliability against avalanche breakdown may be expected.

When the carrier concentration of the p-type regions 71 of the spatial modulation JTE structure 70 is in a range B1 of 1.4×10$^{17}$/cm$^3$ to 2.0×10$^{17}$/cm$^3$, irrespective of whether the insulating layer on the front surface of the semiconductor substrate 40 is charged, the withstand voltage of the edge termination region 2 is stabilized at a withstand voltage that is at least equal to the withstand voltage of the active region 1. Therefore, by setting the target carrier concentration of the p-type regions 71 to be 1.7×10$^{17}$/cm$^3$, which is an average value of the carrier concentration range B1 above, variation of the carrier concentration of the p-type regions 71 of about ±20% is allowable.

In general, a range of the variation of the impurity concentration of the ion implantation is about less than ±10% from the target impurity concentration. Therefore, it was found that in the first example, an allowable range of the variation of the carrier concentration of the p-type regions 71 of the spatial modulation JTE structure 70 may be ensured to be within a range that is wider than the range of variation of ion implantation impurity concentration. The numeric value range of the carrier concentration of the p-type regions 71 of the spatial modulation JTE structure 70 described above is the numeric value range in an instance in which the activation rate of the aluminum ion-implanted to form the p-type regions 71 is 100%. Here, the JTE thickness is assumed to be about 0.5 μm and thus, as for the carrier concentration[/cm$^3$] of the p-type regions 71, a value about the same as 2×10$^4$ times the JTE dose amount[/cm$^2$] on the horizontal axis in FIG. 10 is assumed.

As described above, in general, the activation rate (=concentration of activated impurity/concentration of ion-implanted impurity×100) of an impurity ion-implanted in a silicon carbide layer is in a range of about 70% to 80%. Therefore, for example, in an instance in which the activation rate of an impurity is 70%, to set the carrier concentration of the p-type regions 71 to be 1.7×10$^{17}$/cm$^3$, the target impurity concentration of the p-type regions 71 by ion implantation suffices to be at least about 2.4×10$^{17}$/cm$^3$ (about 1.4 times the carrier concentration). In this manner, in the first example, the impurity concentration of the p-type regions 71 of the spatial modulation JTE structure 70 may be obtained by simulation, and the spatial modulation JTE structure 70 suffices to be designed by a conventional method, based on the impurity concentration of the p-type regions 71.

While not depicted, it was confirmed by the inventor that in the silicon carbide semiconductor device 10 according to the first embodiment described above, similarly to the first example, the withstand voltage of the edge termination region 2 may be set to be sufficiently higher than the withstand voltage of the active region 1 and sufficient reliability against avalanche breakdown may be expected.

Figure 14:
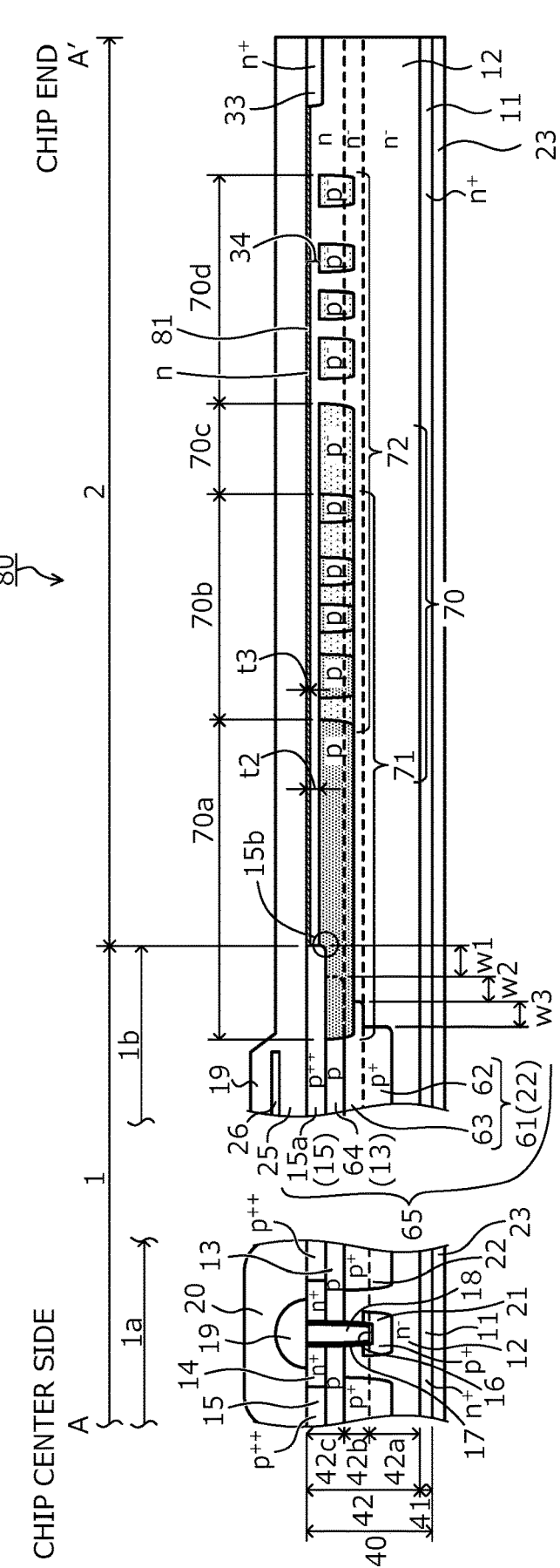
FIG. 14 is a cross-sectional view of a structure of a silicon carbide semiconductor device according to a third embodiment.

Next, a structure of a silicon carbide semiconductor device according to a third embodiment is described. FIG. 14 is a cross-sectional view of the structure of the silicon carbide semiconductor device according to the third embodiment. A layout of a silicon carbide semiconductor device 80 according to the third embodiment when viewed from the front side of the semiconductor substrate 40 is the same as that depicted in FIG. 1. FIG. 14 depicts a cross-section of the structure along cutting line A-A' in FIG. 1. The silicon carbide semiconductor device 80 according to the third embodiment differs from the silicon carbide semiconductor device 60 according to the second embodiment (refer to FIG. 6) in that a second n-type surface region (fifth semiconductor region) 81 having an impurity concentration that is higher than that of the first n-type surface region 34 and the $n^-$-type drift region 12 is provided in a surface region of the first n-type surface region 34 of the edge termination region 2.

The second n-type surface region 81 is a diffused region formed in the first n-type surface region 34 (the n-type silicon carbide layer 42c) by ion implantation. The second n-type surface region 81 extends in the entire edge termination region 2 between the $p^{++}$-type contact extension portion 15a and the $n^+$-type channel stopper region 33 and is provided in contact with the $p^{++}$-type contact extension portion 15a and the $n^+$-type channel stopper region 33. The second n-type surface region 81 is in contact with the insulating layer (the field oxide film 25 and the interlayer insulating film 19) on the front surface of the semiconductor substrate 40 in the edge termination region 2. A thickness t3 of the second n-type surface region 81 may be thinner than the thickness of the $n^+$-type channel stopper region 33. The thickness t3 of the second n-type surface region 81, for example, is at least about 0.1 µm. The second n-type surface region 81 may be as thin as possible and at a depth so as not be in contact with the spatial modulation JTE structure 70 (the p-type regions 71 and the $p^-$-type regions 72).

The second n-type surface region 81 has a function of mitigating adverse effects on the first n-type surface region 34 due to charge accumulated in the insulating layer on the front surface of the semiconductor substrate 40. For example, when negative charge accumulates between the passivation film (not depicted) and the interlayer insulating film 19, holes collect in a surface region of the first n-type surface region 34, whereby a p-type inversion may be formed. When the surface region of the first n-type surface region 34 is inverted into a p-type, adverse effects on withstand voltage characteristics increase and the withstand voltage suddenly decreases. In the third embodiment, the second n-type surface region 81 suppresses inversion of the surface region of the first n-type surface region 34 to a p-type due to negative charge accumulated in the insulating layer on the front surface of the semiconductor substrate 40. For example, the impurity concentration of the second n-type surface region 81 is set to be substantially about the same as the impurity concentration of the n-type current spreading region (not depicted) or the spatial modulation JTE structure 70 (for example, on the order of $10^{17}$/cm$^3$), whereby the withstand voltage characteristics may be more stabilized.

A method of manufacturing the silicon carbide semiconductor device 80 according to the third embodiment may be implemented by adding an ion implantation process for forming the second n-type surface region to the method of manufacturing the silicon carbide semiconductor device 60 according to the second embodiment.

As described above, according to the third embodiment, the second n-type surface region is provided, whereby adverse effects due to charge accumulated in the insulating layer on the front surface of the semiconductor substrate resulting from long operation of the silicon carbide semiconductor device are mitigated and effects similar to the first and second embodiments (suppression of withstand voltage variation and enhancement of reliability) may be further obtained. Further, according to the third embodiment, adverse effects due to charge accumulated in the insulating layer on the front surface of the semiconductor substrate are mitigated by the second n-type surface region, whereby withstand voltage variation may be suppressed even when manufacturing variation of the impurity concentration of the spatial modulation JTE structure is large.

Figure 15:
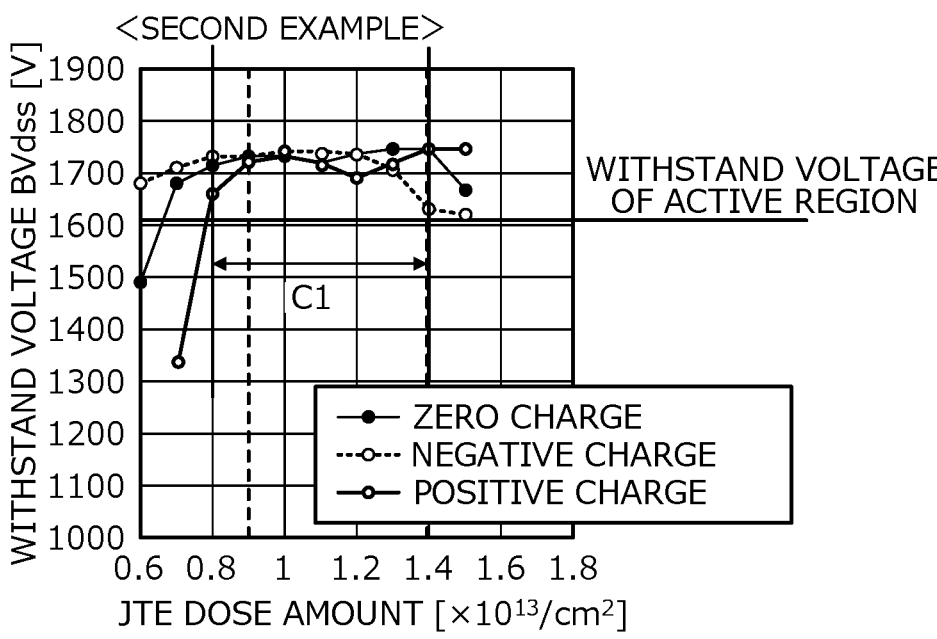
FIG. 15 is a characteristics diagram depicting results of simulating withstand voltage characteristics of a second example.

Withstand voltage characteristics of the silicon carbide semiconductor device 80 according to the third embodiment (hereinafter, second example, refer to FIG. 14) described above were verified. FIG. 15 is a characteristics diagram depicting results of simulating withstand voltage characteristics of the second example. In FIG. 15, a horizontal axis indicates the ion implantation dose amount (JTE dose amount) of aluminum for forming the p-type regions 71 of the spatial modulation JTE structure 70 in the second example. In FIG. 15, a vertical axis indicates the withstand voltage of the edge termination region 2 of the second example.

FIG. 15 depicts results for three instances including an instance in which the insulating layer (the field oxide film 25 and the interlayer insulating film 19) on the front surface of the semiconductor substrate 40 is positively charged (positive charge is accumulated) due to long operation of MOSFET (the second example), an instance in which the insulating layer is negatively charged (negative charge is accumulated) due to long operation of the MOSFET, and an instance of a normal state in which the insulating layer is free of (zero charge). The second example differs from the first example in that the second n-type surface region 81 is provided in a surface region of the first n-type surface region 34 of the edge termination region 2.

From the results depicted in FIG. 15, it was confirmed that even in the second example, as compared to the comparison example above (refer to FIG. 11), the withstand voltage of the edge termination region 2 may be set sufficiently higher than the withstand voltage of the active region 1 and sufficient reliability against avalanche breakdown may be expected. Further, in the second example, when the carrier concentration of the p-type regions 71 of the spatial modulation JTE structure 70 is in a range C1 from $1.6 \times 10^{17}$/cm$^3$ to $3.8 \times 10^{17}$/cm$^3$, irrespective of whether the insulating layer on the front surface of the semiconductor substrate 40 is charged, the withstand voltage of the edge termination region 2 was stable at a withstand voltage at least equal to the withstand voltage of the active region 1.

Therefore, in the second example, the range C1 of the carrier concentration of the p-type regions 71 of the spatial modulation JTE structure 70 may be set wider than the carrier concentration range B1 of the p-type regions 71 of the spatial modulation JTE structure 70 of the first example (refer to FIG. 10). In other words, it was confirmed that in the second example, even when manufacturing variation of the impurity concentration of the spatial modulation JTE structure 70 (the p-type regions 71 and the $p^-$-type regions 72) is greater than that of the first example, the withstand voltage of the edge termination region 2 may be stabilized and ensured to be a withstand voltage that is at least equal to the withstand voltage of the active region 1.

In the second example, the target carrier concentration of the p-type regions 71 is set to be $2.7 \times 10^{17}$/cm$^3$, which is an average value of the carrier concentration range C1, whereby variation of the carrier concentration of the p-type regions 71 has an allowance of about ±40%. The numeric value range of the carrier concentration of the p-type regions 71 of the spatial modulation JTE structure 70 described above is the numeric value range in an instance in which the activation rate of the aluminum ion-implanted to form p-type regions 71 is 100%. Here, the JTE thickness is assumed to be about 0.5 µm and thus, as for the carrier concentration[/cm$^3$] of the p-type regions 71, a value about the same as $2 \times 10^4$ times the JTE dose amount[/cm$^2$] on the horizontal axis in FIG. 15 is assumed.

In the foregoing, the present invention is not limited to the embodiments described and various modifications within a range not departing from the spirit of the invention are possible. For example, the spatial modulation JTE structure may be a structure in which a spatial modulation region is disposed on the outer side of a JTE region (first second-conductivity-type withstand voltage region) configuring a single zone JTE structure, in other words, between the JTE region and the n$^-$-type drift region on the side thereof facing the chip end, the spatial modulation region being adjacent to the JTE region and having an impurity concentration distribution that is spatially equivalent to an intermediate impurity concentration between the impurity concentration of the JTE region and the impurity concentration of the n$^-$-type drift region. In this instance, the spatial modulation region is formed by p-type regions of the same impurity concentration as that of the JTE region and the n$^-$-type drift region disposed to repeatedly alternate with one another in a predetermined pattern. Further, the present invention is similarly implemented when the conductivity types (n-type, p-type) are reversed.

According to the invention described above, electric field is caused to concentrate at the bottom of the first second-conductivity-type withstand voltage region when the silicon carbide semiconductor device is off, thereby enabling distribution in the entire voltage withstanding structure in a direction from the first second-conductivity-type withstand voltage region to the chip end and thus, mitigation. As a result, an occurrence of avalanche breakdown at the outer-side corner of the bottom of the p-type peripheral portion may be suppressed, whereby decreases in the withstand voltage of the edge termination region may be suppressed and the withstand voltage of the edge termination region may be suppressed from becoming lower than the withstand voltage of the active region. As a result, the overall withstand voltage of the silicon carbide semiconductor device may be determined by the withstand voltage of the active region.

According to the invention described above, without changing the method of manufacturing the device element structure of the active region, by performing the ion implantation for forming the second-conductivity-type withstand voltage regions at a predetermined timing, the voltage withstanding structure may be easily formed. Further, at a timing different from that for forming second conductivity regions of the active region, the second-conductivity-type withstand voltage regions having an impurity concentration different from that of the second conductivity regions are formed, configuring the voltage withstanding structure. Here, the mask pattern and dose amount of the ion implantation for forming the second-conductivity-type withstand voltage regions are suitably set, whereby a predetermined withstand voltage of the edge termination region may be ensured.

The silicon carbide semiconductor device according to the present invention achieves an effect in that a highly reliable silicon carbide semiconductor device having a voltage withstanding structure that may be formed easily and that is capable of stabilizing and ensuring the predetermined withstand voltage may be provided.

As described above, the silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a semiconductor substrate containing silicon carbide and having a first main surface and a second main surface that are opposite to each other, the entire first main surface being flat;

an active region provided in the semiconductor substrate;

a termination region provided in the semiconductor substrate, surrounding a periphery of the active region;

a first semiconductor region of a first conductivity type, provided in the semiconductor substrate, spanning the active region and the termination region;

a second semiconductor region of a second conductivity type, provided in the active region, between the first main surface and the first semiconductor region;

a device element structure provided in the active region, and having a pn junction between the first semiconductor region and the second semiconductor region, a current passing through the pn junction flowing through the device element structure;

a second-conductivity-type peripheral region provided between the first main surface and the first semiconductor region, between the device element structure and the termination region, the second-conductivity-type peripheral region surrounding a periphery of the device element structure;

a first electrode provided at the first main surface, the first electrode being electrically connected to the second semiconductor region and the second-conductivity-type peripheral region;

a second electrode provided at the second main surface of the semiconductor substrate, the second electrode being electrically connected to the first semiconductor region;

a plurality of second-conductivity-type withstand voltage regions provided in the first semiconductor region in the termination region, at a position apart from the first main surface in a depth direction, the plurality of second-conductivity-type withstand voltage regions being provided in a concentric shape surrounding the periphery of the active region and being apart from one another in a direction of a normal to the concentric shape; and a voltage withstanding structure configured by the plurality of second-conductivity-type withstand voltage regions and having an overall impurity concentration of the second conductivity type, which gradually decreases in a direction from the active region to the termination region, wherein the second-conductivity-type peripheral region has, at an outer end thereof, a step structure with a plurality of steps, each of the plurality of steps having a predetermined width in the direction of the normal the plurality of steps respectively forming a plurality of extension portions, each of the plurality of extension portions extending outwardly in the direction of the normal, between any two of the plurality of extension portions, the one that is farther away from the first main surface in the depth direction is farther away from the end of the semiconductor substrate in the direction of the normal, the end of the semiconductor substrate being located farther from the active region than from the termination region, bottoms of the plurality of second-conductivity-type withstand voltage regions are positioned closer than a bottom of the second-conductivity-type peripheral region to the first main surface, upper surfaces of the plurality of second-conductivity-type withstand voltage regions are positioned at a same depth as a depth of a bottom of a first extension portion that is closest to the first main surface among the plurality of extension portions or at a depth closer than the depth of the bottom of the first extension portion to the first main surface, a first second-conductivity-type withstand voltage region, which is an innermost one of the plurality of second-conductivity-type withstand voltage regions, is in contact with an outer-side corner of the bottom of the first extension portion or surrounds the first extension portion so as to cover the outer-side corner of the bottom of the first extension portion.

2. The silicon carbide semiconductor device according to claim 1, wherein the predetermined width is at least 2 μm.

3. The silicon carbide semiconductor device according to claim 1, wherein the second-conductivity-type peripheral region has a portion that is closer than the voltage withstanding structure to the second main surface, and that has an impurity concentration of the second conductivity type of at most $1 \times 10^{19}/cm^3$.

4. The silicon carbide semiconductor device according to claim 1, wherein the device element structure includes:

a third semiconductor region of the first conductivity type, selectively provided between the first main surface and the second semiconductor region, the third semiconductor region being electrically connected to the first electrode, a trench that penetrates through the third semiconductor region and the second semiconductor region and reaches the first semiconductor region, a gate insulating film provided in the trench, a gate electrode provided in the trench, on the gate insulating film, and a second-conductivity-type high-concentration region selectively provided between the first semiconductor region and the second semiconductor region, closer than a bottom of the trench to the second main surface, the second-conductivity-type high-concentration region having an impurity concentration that is higher than an impurity concentration of the second semiconductor region, the second-conductivity-type peripheral region includes:

a first peripheral region that is a portion of the second semiconductor region, disposed closer than the device element structure to the end of the semiconductor substrate, the end of the semiconductor substrate being located farther from the active region than from the termination region, a second peripheral region that is a portion of the second-conductivity-type high-concentration region, disposed closer than the device element structure to the end of the semiconductor substrate, the second peripheral region being provided between and in contact with the first peripheral region and the first semiconductor region, and a third peripheral region provided between the first main surface and the first peripheral region, the third peripheral region being in contact with the first peripheral region and having an impurity concentration that is higher than an impurity concentration of the first peripheral region, the plurality of steps of the step structure of the second-conductivity-type peripheral region are formed so that the first peripheral region terminates closer than the third peripheral region to the device element structure, and the second peripheral region terminates closer than the first peripheral region to the device element structure, the first extension portion of the outer end of the second-conductivity-type peripheral region is a portion of the third peripheral region, positioned closer than the first peripheral region to the end of the semiconductor substrate, and the first second-conductivity-type withstand voltage region is in contact with an outer-side corner of a bottom of the third peripheral region or surrounds the outer-side corner of the bottom of the third peripheral region.

5. The silicon carbide semiconductor device according to claim 1, further comprising another semiconductor region of the first conductivity type, provided between the first main surface and the voltage withstanding structure, the another semiconductor region having an impurity concentration that is higher than an impurity concentration of the first semiconductor region.

6. The silicon carbide semiconductor device according to claim 4, wherein each of the plurality of second-conductivity-type withstand voltage regions has a carrier concentration that is equal to or greater than a carrier concentration of the second semiconductor region and lower than a carrier concentration of the second-conductivity-type high-concentration region.

7. The silicon carbide semiconductor device according to claim 1, wherein the plurality of second-conductivity-type withstand voltage regions include:

a plurality of second second-conductivity-type withstand voltage regions, adjacent to the first second-conductivity-type withstand voltage region and closer than the first second-conductivity-type withstand voltage region to the end of the semiconductor substrate, the plurality of second second-conductivity-type withstand voltage regions having an impurity concentration that is a same impurity concentration as an impurity concentration of the first second-conductivity-type withstand voltage region;

a third second-conductivity-type withstand voltage region that is adjacent to the first second-conductivity-type withstand voltage region and closer than the first second-conductivity-type withstand voltage region to the end of the semiconductor substrate, the third second-conductivity-type withstand voltage region being positioned between each adjacent two of the plurality of second second-conductivity-type withstand voltage regions and extending to reach a point closer than an end of an outermost one of the plurality of second second-conductivity-type withstand voltage regions to the end of the semiconductor substrate, the third second-conductivity-type withstand voltage region having an impurity concentration that is lower than the impurity concentration of the first second-conductivity-type withstand voltage region; and a plurality of fourth second-conductivity-type withstand voltage regions that is the rest of the plurality of second-conductivity-type withstand voltage regions excluding the first second-conductivity-type withstand voltage region, the plurality of second second-conductivity-type withstand voltage regions, and the third second-conductivity-type withstand voltage region, the plurality of fourth second-conductivity-type withstand voltage regions being adjacent to the third second-conductivity-type withstand voltage region and closer than the third second-conductivity-type withstand voltage region to the end of the semiconductor substrate, the plurality of fourth second-conductivity-type withstand voltage regions having an impurity concentration that is a same impurity concentration as the impurity concentration of the third second-conductivity-type withstand voltage region, the voltage withstanding structure includes:

the first second-conductivity-type withstand voltage region;

the plurality of second second-conductivity-type withstand voltage regions;

the third second-conductivity-type withstand voltage region;

the plurality of fourth second-conductivity-type withstand voltage regions;

a first spatial modulation region that is disposed adjacent to the first second-conductivity-type withstand voltage region and closer than the first second-conductivity-type withstand voltage region to the end of the semiconductor substrate, the first spatial modulation region having an impurity concentration distribution that is spatially equivalent to an intermediate impurity concentration between the impurity concentration of the first second-conductivity-type withstand voltage region and the impurity concentration of the third second-conductivity-type withstand voltage region, wherein the first spatial modulation region is configured by the plurality of second second-conductivity-type withstand voltage regions and portions of the third second-conductivity-type withstand voltage region, which are disposed adjacently to one another and repeatedly alternate with one another in a predetermined pattern; and a second spatial modulation region that is disposed adjacent to the third second-conductivity-type withstand voltage region and closer than the third secondconductivity-type withstand voltage region to the end of the semiconductor substrate, the second spatial modulation region having an impurity concentration distribution that is spatially equivalent to an intermediate impurity concentration between the impurity concentration of the third second-conductivity-type withstand voltage region and an impurity concentration of the first semiconductor region, wherein the second spatial modulation region is configured by the plurality of fourth second-conductivity-type withstand voltage regions and portions of the first semiconductor region, which are disposed adjacently to one another and repeatedly alternate with one another in a predetermined pattern, and the voltage withstanding structure has the overall impurity concentration of the second conductivity type, which gradually decreases in a direction from the active region to the end of the semiconductor substrate.

8. The silicon carbide semiconductor device according to claim 5, wherein the another semiconductor region of the first conductivity type, provided between the first main surface and the voltage withstanding structure, is a fourth semiconductor region, and the silicon carbide semiconductor device further comprises a fifth semiconductor region of the first conductivity type, provided in a surface region of the fourth semiconductor region and having an impurity concentration that is higher than the impurity concentration of the fourth semiconductor region.

9. The silicon carbide semiconductor device according to claim 8, further comprising a sixth semiconductor region of the first conductivity type, provided between the first main surface and the first semiconductor region, closer to the end of the semiconductor substrate than the fourth semiconductor region, the sixth semiconductor region having an impurity concentration that is higher than the impurity concentration of the first semiconductor region, wherein the fifth semiconductor region has a thickness that is less than a thickness of the sixth semiconductor region.

10. The silicon carbide semiconductor device according to claim 8, wherein the thickness of the fifth semiconductor region is at least 0.1 μm.

* * * * *